(12) United States Patent
Watanabe et al.

(10) Patent No.: US 6,214,749 B1
(45) Date of Patent: Apr. 10, 2001

(54) PROCESS FOR PRODUCING SEMICONDUCTOR DEVICES

(75) Inventors: Hiroyuki Watanabe, Bisai; Hideki Mizuhara, Hashima; Kaori Misawa, Gifu-ken; Masaki Hirase, Hashima; Hiroyuki Aoe, Joyo, all of (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 08/949,283

(22) Filed: Oct. 21, 1997

Related U.S. Application Data

(63) Continuation of application No. 08/528,123, filed on Sep. 14, 1995, now abandoned.

(30) Foreign Application Priority Data

Sep. 14, 1994 (JP) .................................................... 6-247050
Nov. 22, 1994 (JP) .................................................... 6-312774
Mar. 27, 1995 (JP) .................................................... 7-094318
Jun. 21, 1995 (JP) .................................................... 7-179506
Aug. 10, 1995 (JP) .................................................... 7-227294

(51) Int. Cl.[7] .................................................... H01L 21/31
(52) U.S. Cl. .......................... 438/783; 438/623; 438/624; 438/782
(58) Field of Search .................................. 437/231, 240, 437/238, 225, 228; 438/623, 624, 783, 782

(56) References Cited

U.S. PATENT DOCUMENTS 3,747,203 * 7/1973 Shannon .................................. 29/578
4,676,867 * 6/1987 Elkins et al. .......................... 156/643

(List continued on next page.)

FOREIGN PATENT DOCUMENTS

4218495 A1 * 12/1992 (DE) .
58-31519 * 2/1983 (JP) .

(List continued on next page.)

OTHER PUBLICATIONS

Wang, et al., "A Study of Plasma Treatments on Siloxane SOB," IEEE VMIC Conference, Jun. 7–8, 1994, pp. 101–107.*

(List continued on next page.)

Primary Examiner—Wael Fahmy
Assistant Examiner—Long Pham
(74) Attorney, Agent, or Firm—Sheridan Ross, P.C.

(57) ABSTRACT

A semiconductor producing method includes the steps of: forming an SOG pre-film on a semimanufactured semiconductor device by means of spin-on-glass (SOG) process; and forming a modified SOG film by doping the SOG pre-film with at least one impurity ion selected from: inert gas ions; simple ions of Groups IIIb, IVb, Vb, VIb, VIIb, IVa and Va elements; and ions of compounds containing any one of Groups IIIb, IVb, Vb, VIb, VIIb, IVa and Va elements.

14 Claims, 36 Drawing Sheets

U.S. PATENT DOCUMENTS

| | | | |
|---|---|---|---|
| 4,775,550 | * 10/1988 | Chu et al. | 427/38 |
| 4,885,262 | * 12/1989 | Ting et al. | 437/231 |
| 4,885,562 | * 12/1989 | Ting et al. | 437/240 |
| 4,962,052 | 10/1990 | Asayama et al. | 437/31 |
| 4,983,546 | * 1/1991 | Hyun et al. | 437/231 |
| 4,984,055 | 1/1991 | Okumura et al. | 357/54 |
| 5,003,062 | * 3/1991 | Yen | 437/231 |
| 5,084,412 | * 1/1992 | Nakasaki | 257/762 |
| 5,106,787 | * 4/1992 | Yen | 437/231 |
| 5,153,680 | * 10/1992 | Naito et al. | 357/8 |
| 5,166,768 | * 11/1992 | Ito | 257/523 |
| 5,186,745 | * 2/1993 | Maniar | 106/287.16 |
| 5,192,697 | * 3/1993 | Leong | 437/37 |
| 5,270,259 | 12/1993 | Ito et al. | 437/235 |
| 5,314,834 | 5/1994 | Mazure et al | 437/43 |
| 5,352,630 | * 10/1994 | Kim et al. | 437/195 |
| 5,429,990 | * 7/1995 | Liu et al. | 437/225 |
| 5,468,684 | 11/1995 | Yoshimori et al. | 437/228 |
| 5,479,054 | * 12/1995 | Tottori | 257/760 |
| 5,496,776 | * 3/1996 | Chien et al. | 437/231 |
| 5,549,786 | * 8/1996 | Jones et al. | 156/662.1 |
| 5,569,618 | * 10/1996 | Matsubara | 437/52 |
| 5,753,975 | * 5/1998 | Matsuno | 257/760 |
| 5,786,273 | 7/1998 | Hibi et al. | 438/637 |
| 5,817,582 | * 10/1998 | Maniar | 438/782 |
| 5,855,962 | * 1/1999 | Cote et al. | 427/376.2 |
| 5,930,624 | 7/1999 | Murata et al. | 438/253 |
| 5,963,827 | 10/1999 | Enomoto et al. | 438/629 |
| 6,013,578 | 1/2000 | Jun | 438/687 |

FOREIGN PATENT DOCUMENTS

| | | | |
|---|---|---|---|
| 59-17243 | * 1/1984 | (JP) . | |
| 62-60242 | 3/1987 | (JP) | H01L/21/88 |
| 2-26055 | 7/1988 | (JP) | H01L/21/90 |
| 1-199456 | 8/1989 | (JP) | H01L/21/90 |
| 1-307247 | * 12/1989 | (JP) . | |
| 2-26055 | 1/1990 | (JP) | H01L/21/90 |
| 2-7451 | 1/1990 | (JP) | H01L/21/90 |
| 2-101532 | * 8/1990 | (JP) . | |
| 4-234149 | 8/1990 | (JP) | H01L/21/90 |
| 2-235358 | * 9/1990 | (JP) . | |
| 2-253643 | 10/1990 | (JP) | H01L/21/90 |
| 3-101130 | 4/1991 | (JP) | H01L/21/214 |
| 4-317358 | 11/1992 | (JP) | H01L/21/90 |
| 5-226334 | * 3/1993 | (JP) . | |
| 5-74963 | 3/1993 | (JP) | H01L/21/90 |
| 5-198523 | 8/1993 | (JP) | H01L/21/265 |
| 6-275229 | 9/1994 | (JP) | H01L/37/317 |
| 6-349950 | 12/1994 | (JP) | H01L/21/90 |
| 7-99195 | 4/1995 | (JP) | H01L/21/3205 |
| 8-17770 | 1/1996 | (JP) | H01L/21/304 |
| 8-64561 | 3/1996 | (JP) | H01L/21/304 |
| 8-241891 | * 9/1996 | (JP) . | |
| 9-330982 | * 12/1997 | (JP) . | |
| 10-209147 | * 8/1998 | (JP) . | |
| 10-303295 | * 11/1998 | (JP) . | |
| 80106929 | * 9/1991 | (TW) . | |
| 83101499 | * 1/1994 | (TW) . | |

OTHER PUBLICATIONS

Chiang et al., Defects Study on Spin on Glass Planarization Technology, IEEE VMIC Conference, Jun. 15–16, 1987, pp. 404–412.*

Lai–Juh Chen, et al., "Fluorine–Implanted Treatment (FIT) SOG for the Non–Etchback Intermetal Dielectric," IEEE VMIC Conference, Jun. 7–8, 1994, pp. 81–86.*

Moriya et al., "Modification Effects in Ion–Implanted $SiO_2$, Spin–on–Glass," *J. Electrochem. Soc.*, vol. 140, No. 5, May 1993, pp. 1442–1450.*

Matsuura et al., "An Advanced Interlayer Dielectric System with Partially Converted Organic SOG Using Plasma Treatment," IEEE VMIC Conference, Jun. 8–9, 1993, pp. 113–115.*

Ishida et al., "Mechanism for AlSiCu Alloy Corrosion," *Jpn. J. Appl. Phys.*, vol. 31 (1992), pp. 2045–2048.*

Doki et al., "Moisture–Blocking Mechanism of ECR–Plasma," IEEE VMIC Conference, Jun. 7–8, 1994, pp. 235–139.*

Shimokawa et al., "Suppression of MOSFET hot carrier degradation by P–SiO underlayer," *The Institute of Electronics, Information and Communication Engineers*, Technical Report of IEICE, SDM92–133 (1992–12), pp. 89–94.*

Murase et al., "Dielectric Constant of Silicon Dioxide Deposited by Atmospheric–Pressure Chemical Vapor Deposition Using Tetraethylorthosilicate and Ozone," *Jpn. J. Appl. Phys.*, vol. 33 (1994), pp. 1385–1389.*

Wolf et al., "Silicon Processing for the VLSI Era: vol. 1 –Process Technology", Lattice Press, 1986, p. 441.

Wolf et al., "Silicon Processing for the VLSI Era: vol. 2 –Process Intergration", Lattice Press, 1990, pp. 232–233.

* cited by examiner

C(F)
1.135 x 10⁻¹⁰

ION IMPLANTED
(Ar + 140keV
1 x 10¹⁵ cm-2)

C(F)
1.115 x 10⁻¹⁰

ANNEALED
AFTER IMPLANTATION

500°C

C(F)
1.117 x 10⁻¹⁰

600°C

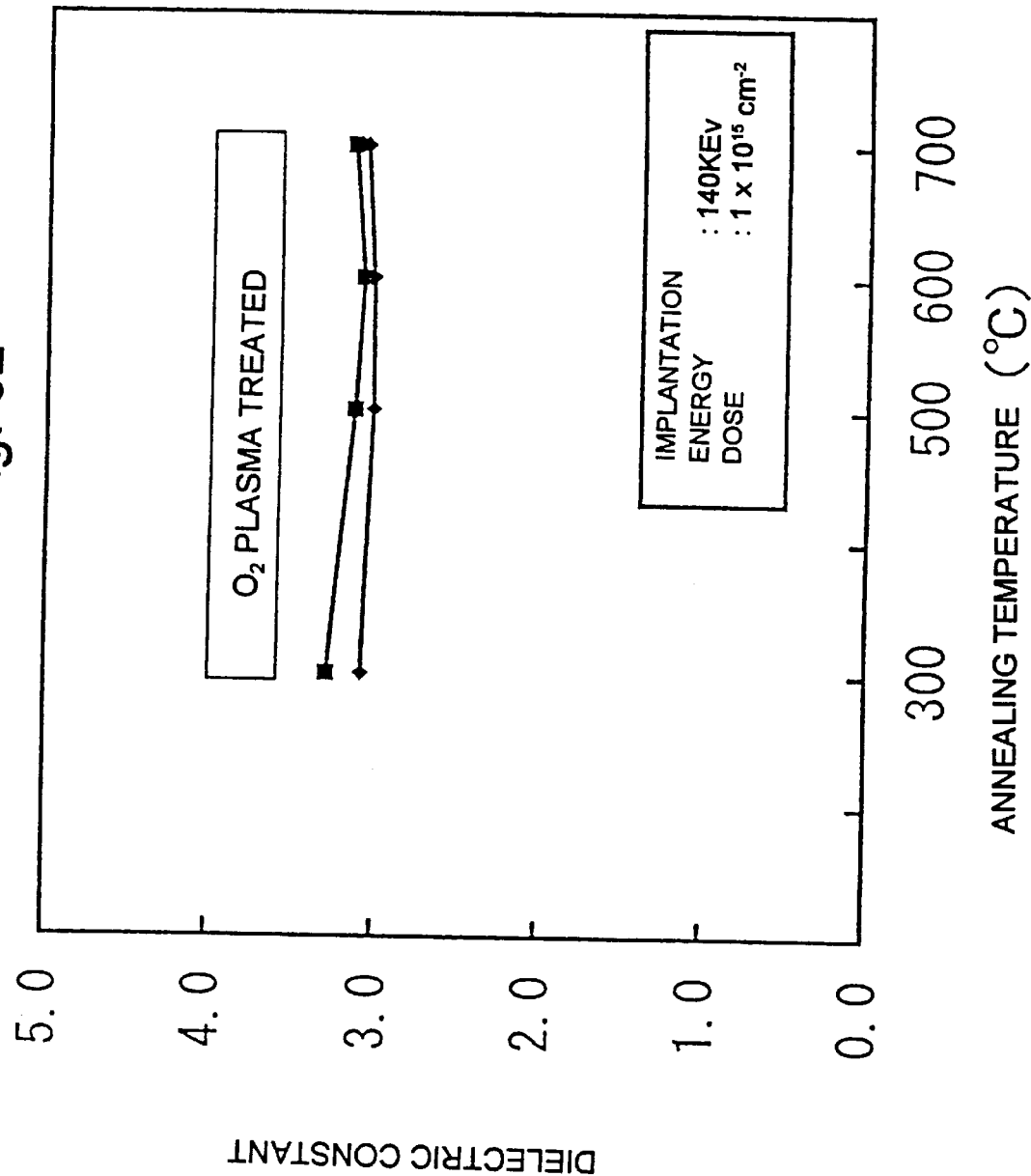

PROCESS FOR PRODUCING SEMICONDUCTOR DEVICES

This is a File Wrapper Continuation Application of application Ser. No. 08/528,123, filed on Sep. 14, 1995 now abandoned.

BACKGROUND OF THE INVENTION

1. Field of the Invention

The present invention relates generally to a process for producing semiconductor devices and also to semiconductor devices produced according to the process. In particular, the present invention relates to a process for producing a Spin-on-Glass (SOG) film and also to an interlayer insulation film employing the SOG film.

2. Description of the Related Art

In order to realize higher integration of semiconductor integrated circuits, wiring must be much finer and multilayered. Interlayer insulation films are interposed between wiring layers so as to obtain multilayered wiring or interconnections. If the interlayer insulation films do not have flat surfaces, wiring layers formed on the insulation films are stepped, which leads to problems such as disconnection of wiring. Accordingly, the surfaces of the interlayer insulation films (i.e. the surfaces of the devices) must be as flat as possible. The technique of flattening the surface of a device is called planarization, which becomes more important as the wiring becomes finer and the number of layers increases.

SOG film is the type of interlayer insulation film which is most frequently employed in planarization. The use of SOG film has been researched and developed particularly with respect to planarization techniques utilizing flow characteristics of material for interlayer insulation films. In general, SOG means solutions of silicon-containing compounds in organic solvents as well as films that are formed from such solutions and that contain silicon dioxide as a major component. In forming an SOG film, a solution of a silicon-containing compound in an organic solvent is first dropped onto a substrate, which is in turn rotated. Then, the surface of the substrate is covered by the solution with recesses on the substrate filled by the solution. A wet silicon-containing film is thus formed such that the steps inherently formed on the substrate by wiring or interconnections may be compensated for. Thus, the surface of the substrate is planarized. Subsequently, the thus treated substrate is subjected to heat treatment to completely evaporate the organic solvent and promote polymerization reaction resulting in an SOG film having a flat surface.

SOG films include inorganic SOG films, in which the silicon-containing compounds contain no organic component, as represented by the following chemical formula (1):

$$[SiO_2]_n \quad (1),$$ and organic SOG films, in which the silicon-containing compounds contain organic components, as represented by the following chemical formula (2):

$$[R_xSiO_y]_n \quad (2)$$

wherein n, X and Y are integers; and R represents an alkyl group or an aryl group.

In general, inorganic SOG films involve disadvantages in that they are likely to contain water and hydroxyl groups in large amounts and that they are brittle compared with silicon oxide films formed by a Chemical Vapor Deposition (CVD) method and readily crack during heat treatment when the films have a thickness of 0.5 μm or more. In contrast, organic SOG films have a molecular structure in which the linkages are partly blocked by alkyl or aryl groups. For this reason, cracking, which is liable to occur during heat treatment, can be controlled so that an organic SOG film having a thickness of about 0.5 μm to 1.0 μm is allowed to form. Accordingly, the use of organic SOG film permits not only the formation of a thick interlayer insulation film but also permits the planarization of the surface of a substrate having steps present thereon.

However, since organic SOG film contains organic components (i.e., hydrocarbon components), the rate of etching in defining via-contact holes is low where a mixed gas of carbon tetrafluoride and hydrogen ($CF_4+H_2$) is used. To increase the etching rate, therefore, it is preferable to use a mixed gaseous system of carbon tetrafluoride and oxygen ($CF_4+O_2$) in the etching treatment for forming via-contact holes in an organic SOG film. When such mixed gas of carbon tetrafluoride and oxygen is used as etching gas, however, a photoresist as an etching mask is unfortunately etched by the gas. As a result, the organic SOG film masked with the photoresist is also etched leading to the failure of accurate fine via-contact hole formation.

Organic SOG films also contain some water and hydroxyl groups, although the amounts are small compared with the case of inorganic SOG films. In general, the insulating properties and the mechanical strength of the SOG films are lower than those of the silicon oxide film formed by CVD method. Accordingly, when an SOG film is employed as an interlayer insulation film, a sandwich structure is often used where insulating films having high insulating property and high mechanical strength, in addition to the property of blocking water, are formed on upper and lower surfaces of the SOG film. Silicon oxide films formed by CVD process are usually employed as such additional insulating films.

However, since organic SOG film contains organic components, the organic SOG film is etched more than the upper and lower silicon oxide films are in the etching treatment for defining via-contact holes due to the water contained in the organic SOG film and the oxygen fed from the lower silicon oxide film. Further, in an ashing process, where the photoresist used as an etching mask is removed, the organic components contained in the organic SOG film are decomposed so that the organic SOG film is likely to shrink. Consequently, the organic SOG film cracks or retracts to form recesses therein. This is referred to as retrogression. If such recesses are formed, the via-contact holes cannot be fully filled with a wiring material, when wiring is to be formed by means of sputtering, resulting in the failure in securing excellent electric contact between two interconnections. Furthermore, when the organic components contained in the organic SOG film decompose, hygroscopicity of the organic SOG film is increased. These issues or topics are discussed in detail by C. K. Wang, L. M. Liu, H. C. Cheng, H. C. Huang and M. S. Lin in Proc. of IEEE VMIC, p.101 (1994).

Japanese Unexamined Patent Publication No. 1-307247 discloses a method in which an organic SOG film is subjected to $O_2$ plasma treatment to convert the C—Si bond in the film to Si—O—Si bond, decomposing organic components contained in the organic SOG film. FIG. 1 shows IR absorption spectra of the organic SOG film before and after $O_2$ plasma treatment. Incidentally, the organic SOG film has a film thickness of 3000 Å. Referring to the method of forming the organic SOG film, a solution of the silicon-containing compound ($CH_3Si(OH)_3$) in ethanol is dropped onto a substrate, and the substrate is then rotated at 4800 rpm for 20 seconds to form a wet film of the solution on the substrate. Subsequently, the thus treated substrate is heat-treated successively at 100° C. for one minute, at 200° C. for one minute, at 300° C. for one minute, at 22° C. for one minute and at 300° C. for 30 minutes in a nitrogen atmosphere to form an organic SOG film on the substrate. Next, the organic SOG film is subjected to an $O_2$ plasma treatment for 60 seconds under the following conditions: RF power= 500 W; preset temperature=360° C.; oxygen flow rate=600 sccm.

In the IR absorption spectra of the organic SOG film shown in FIG. 1, the graphs 44-1, 44-2, 44-3 and 44-4 are spectra at the times: immediately after the formation of the SOG film (before the $O_2$ plasma treatment); immediately after the $O_2$ plasma treatment; after 3-day exposure under atmospheric condition in a clean room from the $O_2$ plasma treatment; and after 7-day exposure under atmospheric condition in a clean room after the $O_2$ plasma treatment, respectively.

As the graph 44-1 shows, absorption peaks attributed to organic components are observed around the wave numbers of about 3000 $cm^{-1}$ and 1250 $cm^{-1}$ before the $O_2$ plasma treatment. The absorption peak around 3000 $cm^{-1}$ is caused by the C—H bond stretching; whereas the absorption peak around 1250 $cm^{-1}$ is caused by the C—H bond deformation or bending vibration. However, as the graphs 44-2 to 44-4 show, no absorption peak is observed around 3000 $cm^{-1}$ and 1250 $cm^{-1}$ after the $O_2$ plasma treatment. Accordingly, it can be understood that the organic components contained in the organic SOG film are decomposed by the $O_2$ plasma treatment.

However, as the graph 44-2 shows, absorption peaks attributed to hydroxyl groups are observed around 3600 $cm^{-1}$ and 930 $cm^{-1}$ immediately after the $O_2$ plasma treatment. Generally, the absorption peak around 3600 $cm^{-1}$ is caused by the O—H bond stretching in H—OH and Si—OH; whereas the absorption peak around 930 $cm^{-1}$ is caused by the Si—O bond stretching in Si—OH. As the graphs 44-2 to 44-4 show, the absorption peaks around 3600 $cm^{-1}$ and 930 $cm^{-1}$ increase with time after the $O_2$ plasma treatment. This is because the organic SOG film subjected to the $O_2$ plasma treatment absorbs water in the atmosphere. Even if the organic SOG film is not subjected to the $O_2$ plasma treatment, the film also absorbs water in the atmosphere, and the absorption peaks around 3600 $cm^{-1}$ and 930 $cm^{-1}$ increase with time. However, in the case of the organic SOG film subjected to the $O_2$ plasma treatment, the increase in the absorption peaks is much more notable. As described above, the technique of applying an $O_2$ plasma treatment to the organic SOG film involves the disadvantage that water and hydroxyl groups in the film increase, although it enjoys the advantage that organic components are decomposed.

Increase of the water and hydroxyl groups contained in the SOG film brings about defects such as "poisoned via phenomenon". The "poisoned via phenomenon" is a phenomenon where, when a metal is used for wiring, the wiring present in the via-contact holes is corroded by the water contained in the SOG film exposed to the via-contact holes. Further, it also happens that the water contained in the SOG film exposed to the via-contact holes reacts with the wiring filled in the via-contact holes to disadvantageously increase contact resistance. These issues or topics are discussed in detail by C. Chiang, N. V. Lam, J. K. Chu, N. Cox, D. Fraser, J. Bozarth and B. Mumford in Proc. of IEEE VMIC, p.404 (1987).

In order to overcome these problems, the above-described sandwich structure (where an SOG film is sandwiched by two silicon oxide films formed by CVD process) may be employed, and the SOG film may be etched back before the formation of the upper silicon oxide film. Thus, an inner wall of each via-contact hole can be composed of the upper and lower silicon oxide films only, with no exposed SOG film. However, the necessity of the step of etching back the SOG film complicates the production process, and thus lowers throughput.

Under such circumstances, one method has been proposed in which an organic SOG film is doped with fluorine by means of ion implantation to decompose organic components and also to reduce the water and hydroxyl groups contained in the SOG film (see L. J. Chen, S. T. Hsia and J. L. Leu, Proc. of IEEE VMIC, p.81 (1994)). This article describes that when fluorine ions were implanted at a dose of $3\times10^{15}$ $cm^{-2}$ to an organic SOG film having a film thickness of 4000 Å with an acceleration energy of 40 keV or 80 keV, and the resulting SOG film was subjected to heat treatment at 425° C. for 30 minutes, the water contained in the organic SOG film was reduced.

It has also been proposed to dope an organic SOG film with silicon or phosphorus by means of ion implantation so as to decompose organic components (see N. Moriya, Y. Shacham-Diamond and R. Kalish, J. Electrochem. Soc., Vol. 140, No. 5, p.1442 (1993)). Furthermore, a method has also been proposed in which organic components in an organic SOG film are decomposed by applying, for example, argon (Ar), nitrogen ($N_2$) or nitrogen oxide ($N_2O$) plasma treatment to the SOG film (see C. K. Wang, L. M. Liu, H. C. Cheng, H. C. Huang and M. S. Lin, Proc. of IEEE VMIC, p.101 (1994); M. Matsuura, Y. Ii, K. Shibata, Y. Hayashide and H. Kotani, Proc. of IEEE VMIC, p.113 (1993)).

However, the method of doping an organic SOG film with fluorine by means of ion implantation involves the following disadvantages.

(1) When aluminum is used for wiring, the aluminum wiring may be corroded by the fluorine contained in the SOG film (see Jpn. J. Appl. Phys. Vol. 31, pp.2045–2048 Part 1, No.6B, June 1992).

(2) When a fluorine-doped SOG film is formed on a MOS transistor, the dielectric constant of a gate insulation film is lowered by the fluorine contained in the SOG film so that the effective thickness of the gate insulation film should be increased. Consequently, the designed characteristic values of the MOS transistor, e.g., threshold voltage, are changed.

(3) If a fluorine-doped SOG film is formed on a MOS transistor and subsequently source-drain regions of the transistor should be formed by diffusion of an impurity such as phosphorus or boron, the diffusion of the impurity may be inhibited by the fluorine-doped SOG film. Consequently, the designed characteristic values of the MOS transistor are changed.

(4) The method of doping an organic SOG film with a phosphorus or a phosphorus-containing compound by means of ion implantation involves the disadvantage, provided that aluminum is used for wiring, that the phosphorus reacts with the water contained in the SOG film to produce phosphoric acid ($H_3PO_4$) which corrodes the aluminum wiring. Further, the method of doping an organic SOG film with silicon or a silicon-containing compound by means of ion implantation involves the disadvantage that conductivity of the SOG film is increased to exhibit deteriorated performance as interlayer insulation film.

SUMMARY OF THE INVENTION

Accordingly, it is a primary objective of the present invention to provide a process for producing a semiconductor device with less water and hydroxyl groups contained in the SOG film.

It is another objective of the present invention to provide a process for producing a semiconductor device, by which organic components contained in the SOG film can be decomposed and also the water and hydroxyl groups contained in the SOG film can be reduced.

It is further objective of the invention to provide a semiconductor device having an interlayer insulation film which has excellent flatness and avoids defects such as poisoned via phenomenon.

To achieve the foregoing and other objects and in accordance with the purpose of the present invention, an improved method is provided for producing a semiconductor device.

In the method according to the present invention, an SOG pre-film is formed on a semimanufactured semiconductor device by means of spin-on-glass (SOG) process. Subsequently, a modified SOG film is formed by doping the SOG pre-film with at least one impurity ion selected from the group consisting of: inert gas ions; simple ions of Groups IIIb, IVb, Vb, VIb, VIIb, IVa and Va elements; and ions of compounds containing any one of Groups IIIb, IVb. Vb, VIb, VIIb, IVa and Va elements.

It is preferable that the selected impurity ion is any one of: ions of inert gases selected from the group consisting of helium (He), neon (Ne), argon (Ar), krypton (Kr), xenon (Xe) and radon (Rn); simple ions of elements selected from the group consisting of boron (B), nitrogen (N), oxygen (O), aluminum (Al), sulfur (S), chlorine (Cl), gallium (Ga), germanium (Ge), arsenic (As), selenium (Se), bromine (Br), antimony (Sb), iodine (I), indium (In), tin,(Sn), tellurium (Te), lead (Pb), bismuth (Bi), titanium (Ti), vanadium (V), niobium (Nb), hafnium (Hf) and tantalum (Ta); ions of compounds containing any one of B, N, O, Al, S, Cl, Ga, Ge, As, Se, Br, Sb, I, In, Sn, Te, Pb, Bi, Ti, V, Nb, Hf and Ta; and ions of fluorine-containing compounds selected from the group consisting of silicon fluoride and boron fluoride.

BRIEF DESCRIPTION OF THE DRAWINGS

The features of the present invention that are believed to be novel are set forth with particularity in the appended claims. The invention, together objects and advantages thereof, may best be understood by reference to the following description of the presently preferred embodiments taken in conjunction with the accompanying drawings in which:

FIGS. 27A, 27B, 28A, 28B, 29, 30, 31A, 31B, 31C and 32 to 35 are diagrams and graphs illustrating the characteristics of SOG films;

DETAILED DESCRIPTION OF THE PREFERRED EMBODIMENTS

First Embodiment

Figure 2A:
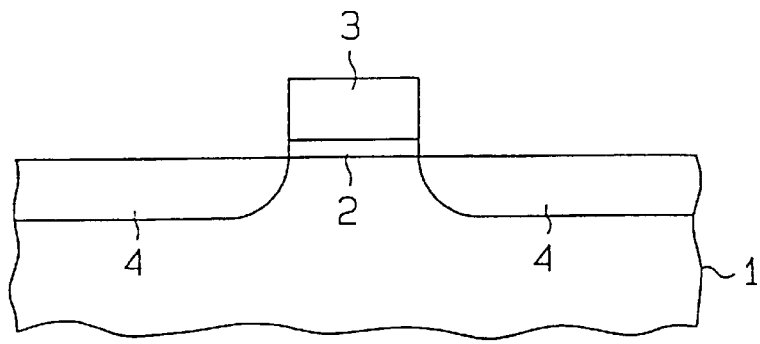
FIGS. 2A, 2B, 2C, 3A, 3B and 3C are cross sectional drawings illustrating manufacturing steps of a semiconductor device accordiyg a first embodiment of the present invention.

A process for producing a semiconductor device according to a first embodiment of the invention will now be described referring to FIGS. 2A to 2C and 3A to 3C. First, as shown in FIG. 2A, a gate insulation film 2 (film thickness: 100 Å) and a gate electrode 3 (film thickness 2000 Å) are formed on a p-type (or n-type) monocrystalline silicon substrate 1 with Miller indices of (100). Then, the substrate 1 is doped with an n-type (or p-type) impurity by means of ion implantation utilizing the gate insulation film 2 and gate electrode 3 as a mask to form source and drain regions 4 in self alignment to complete a MOS transistor.

Figure 2B:
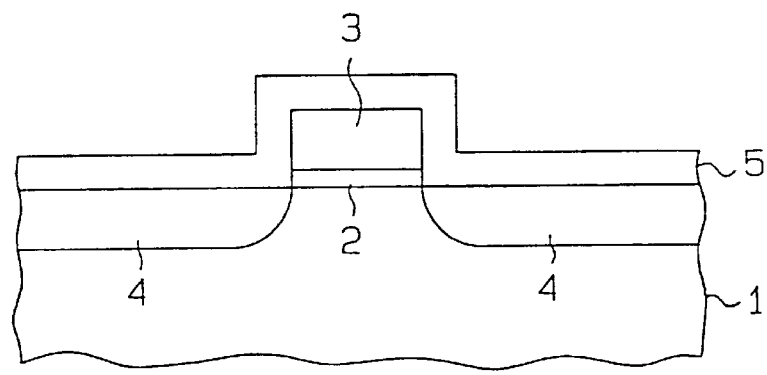

Next, as shown in FIG. 2B, a silicon oxide film 5 (film thickness: 1500 Å) is formed over the entire surface of the device by means of plasma CVD method. The gas to be employed in this plasma CVD process includes, for example, monosilane and nitrogen suboxide ($SiH_4+N_2O$), monosilane and oxygen ($SiH_4+O_2$), and tetra-ethoxy-silane (TEOS) and oxygen ($TEOS+O_2$). The silicon oxide film 5 is formed at a temperature of 300 to 900° C.

Figure 2C:
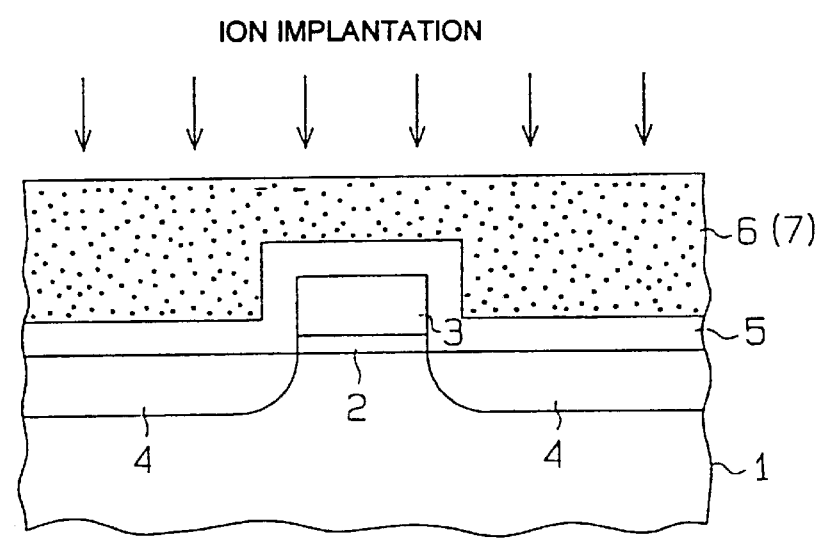

Subsequently, as shown in FIG. 2C, an organic SOG pre-film 6 is formed on the silicon oxide film 5. The organic SOG pre-film 6 has a film thickness of 4000 521 . Referring to the method of forming the organic SOG pre-film 6, a solution of the silicon-containing compound ($CH_3Si(OH)_3$) in ethanol is first dropped onto the substrate 1, and then the substrate is rotated at 4800 rpm for 20 seconds to form a film of the solution on the substrate 1. In this process, the wet film of the ethanol solution is formed to compensate for steps present on the substrate. That is, the surface of the substrate 1 is covered by the ethanol solution with recesses of the substrate fill by the solution, so that the surface of the ethanol solution film is planarized. Next, the thus treated substrate is heat-treated successively at 100° C. for one minute, at 200° C. for one minute, at 300° C. for one minute, at 22° C. for one minute and at 300° C. for 30 minutes in a nitrogen atmosphere to evaporate the ethanol and water. This promotes a polymerization reaction of the silicon-containing compound ($CH_3Si(OH)_3$), producing the organic SOG pre-film 6 having a flat surface.

The organic SOG pre-film 6 is then doped with an ion selected from the group described later by means of ion implantation to decompose the organic components, as well as, to reduce the water and hydroxyl groups contained in the film. As a result, the organic SOG pre-film 6 is converted to an SOG film (hereinafter referred to as a modified SOG film) 7 containing no organic component and less amounts of water and hydroxyl groups.

Figure 3A:
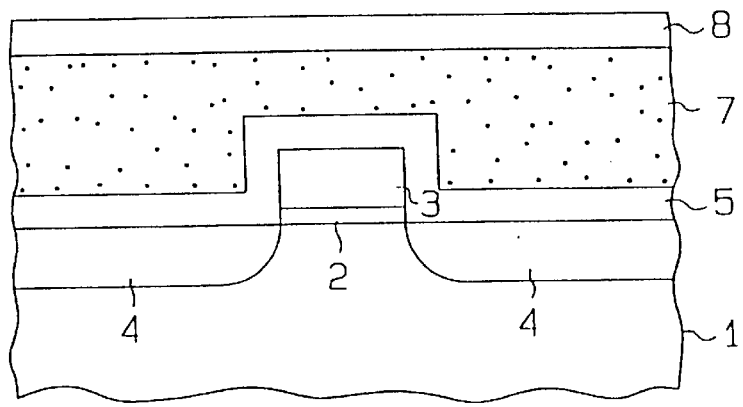
Figure 3B:
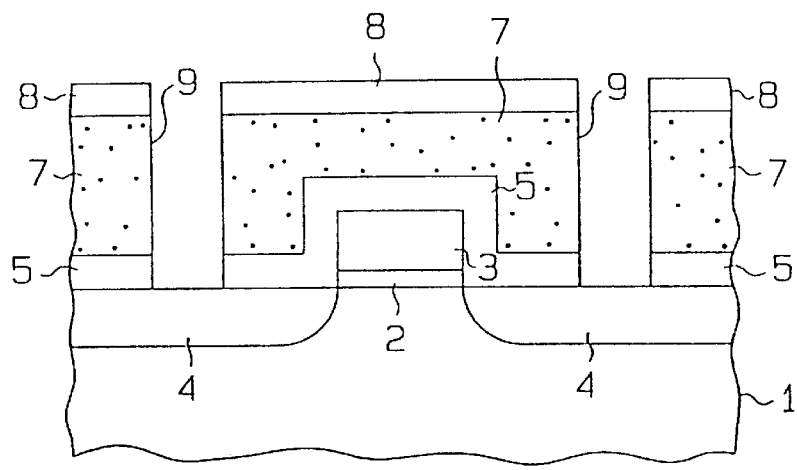
Figure 3C:
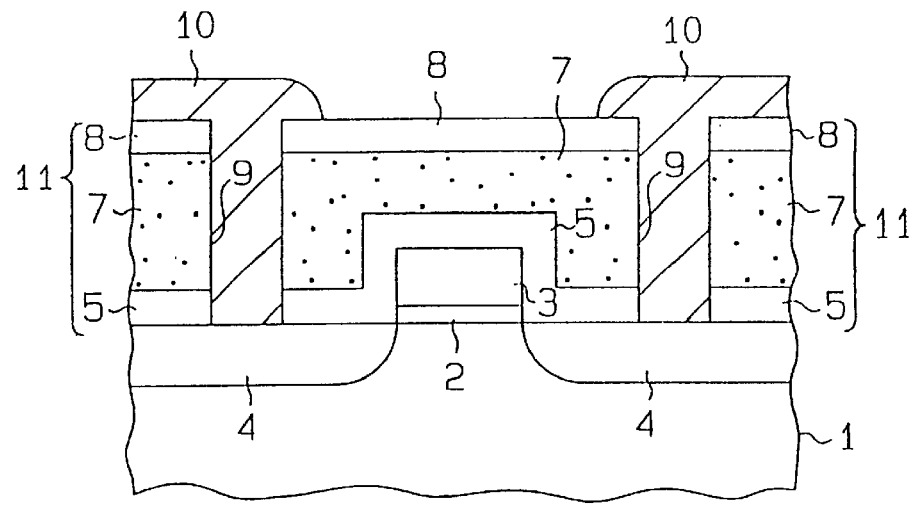

Next, as shown in FIG. 3A, a silicon oxide film 8 (film thickness: 2000 Å) is formed on the modified SOG film 7 by means of plasma CVD method. The upper silicon oxide film 8 is formed under the same conditions as the lower silicon oxide film 5 is formed. Subsequently, as shown in FIG. 3B, the device is subjected to anisotropic etching using a mixed gaseous system of carbon tetrafluoride and hydrogen as an etching gas to form via-contact holes 9 through the films 5, 7 and 8 on and above the source and drain regions 4. Then, as shown in FIG. 3C, an aluminum layer is deposited on the entire surface of the device and within the bores of the via-contact holes 9. The thus formed aluminum film is subjected to anisotropic etching to form source and drain electrodes (source and drain wiring layer) 10 having a desired pattern.

According to the production process of the present invention, the following advantages can be obtained.

(1) An interlayer insulation film 11 having a three-layered structure consisting of the lower silicon oxide film 5, the modified SOG film 7 and the upper silicon oxide film 8 is provided on a MOS transistor. The provision of the modified SOG film 7 prevents the cracking of the insulation film, which is liable to occur during the heat treatment, and allows the insulation film to be formed with a film thickness of 0.5 to 1.0 $\mu$m. Accordingly, the use of the modified SOG film 7 enables thickening of the interlayer insulation film 11 and sufficient planarization of the insulation film 11 even if great steps are present on the substrate 1.

(2) The reason why the sandwich structure consisting of a modified SOG film 7 sandwiched between the two silicon oxide films 5 and 8 is employed is to enhance insulating property and mechanical strength of the interlayer insulation film 11 as a whole. The reason why the lower silicon oxide film 5 is formed is to eliminate influence of the water and hydroxyl groups contained in small amounts in the modified SOG film on the MOS transistor. Although the modified film 7 has low hygroscopicity, the upper silicon oxide film 8 is formed so as to prevent the modified SOG film 7 from absorbing water in the atmosphere.

(3) Since the modified SOG film 7 contains little organic component, the etching treatment for forming via-contact holes 9 can be carried out in a mixed gaseous system of carbon tetrafluoride and hydrogen. Accordingly, even when a photoresist is employed as an etching mask in this etching treatment, the photoresist remains intact, so that the modified SOG film 7 masked by the photoresist also remains unetched. This permits fine via-contact holes 9 to be formed accurately.

(4) Since the modified SOG film 7 contains little organic component, the modified SOG film 7 and the silicon oxide films 5 and 8 can be etched at the same rate. Additionally, it does not happen that the modified SOG film 7 shrinks during the ashing treatment for removing the photoresist used as the etching mask. Accordingly, the modified SOG film 7 does not undergo cracking, and further no recess is formed on the inner wall of via-contact holes 9. Thus, an aluminum contact can be embedded in the via-contact holes 9, providing excellent electrical connection between the source and drain electrodes 10 and the source and drain regions 4.

(5) Since the modified SOG film 7 contains little organic component and contains very small amounts of water and hydroxyl groups, the silicon oxide films 5 and 8 may be omitted and the single modified SOG film 7 may be used as an interlayer insulation film.

Second Embodiment

Figure 4A:
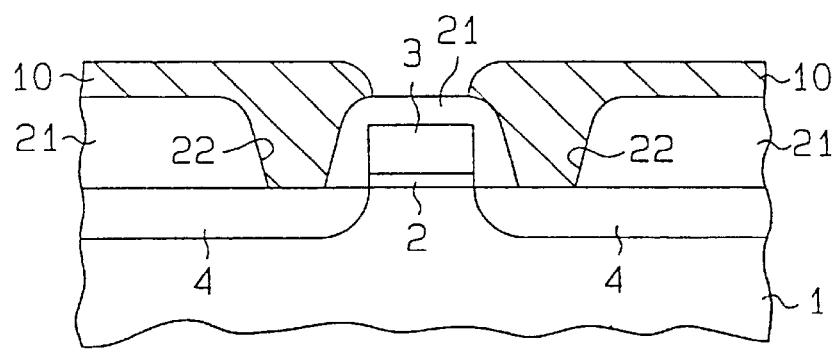
FIGS. 4A, 4B, 4C, 5A, 5B and 5C are cross sectional drawings illustrating manufacturing steps of a semiconductor device according to a second embodiment of the present invention.
Figure 4B:
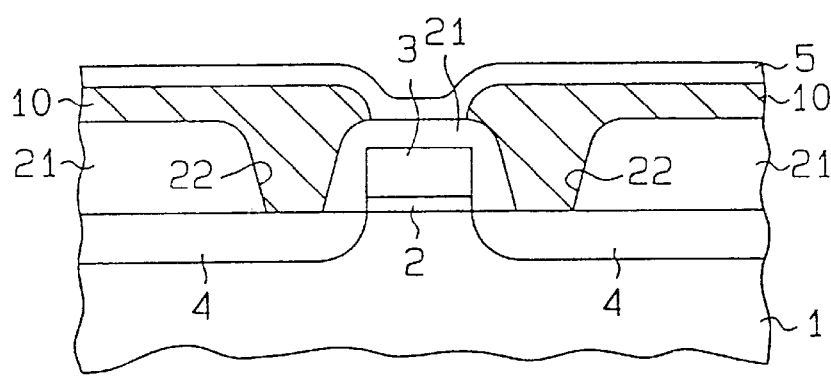
Figure 4C:
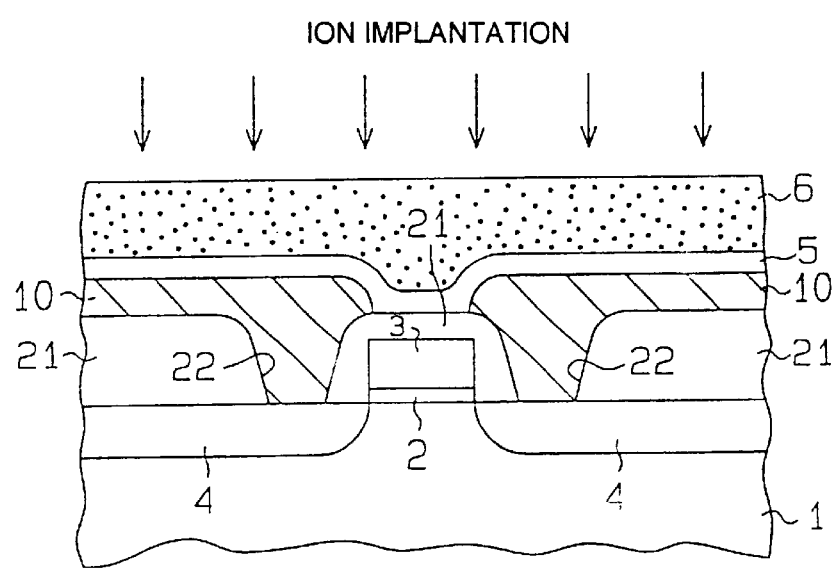

The process for producing a semiconductor device according to a second embodiment of the present invention will now be described referring to FIGS. 4A to 4C and 5A to 5C. It should be noted here that the similar components as in the first embodiment are affixed with the same reference numbers respectively and detailed description of them will be omitted. First, as shown in FIG. 4A, a gate insulation film 2 and a gate electrode 3 are formed on a p-type (or n-type) monocrystalline silicon substrate 1, followed by formation of source and drain regions 4 to complete a MOS transistor. An interlayer insulation film 21 is then formed over the entire surface of the device, and via-contact holes 22 are defined through the interlayer insulation film 21 locating on the source and drain regions 4. Subsequently, an aluminum film is deposited by means of sputtering over the entire surface of the film 21 and within the bores of the via-contact holes 22, and the thus formed aluminum film is subjected to anisotropic etching to form source and drain electrodes (source and drain wiring) 10 having a desired pattern. Next, as shown in FIG. 4B, a lower silicon oxide film 5 is formed over the entire surface of the device. Subsequently, an organic SOG pre-film 6 is formed on the silicon oxide film 5, as shown in FIG. 4C, followed by ion implantation to convert the organic SOG pre-film 6 into a modified SOG film 7, like the first embodiment.

Figure 5A:
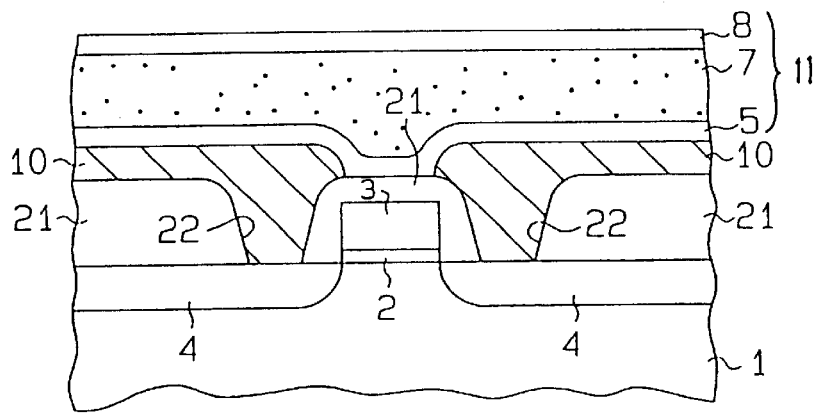
Figure 5B:
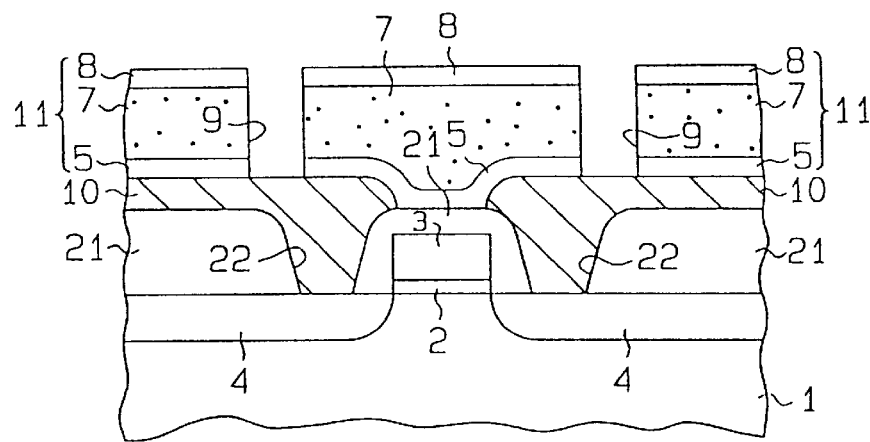
Figure 5C:
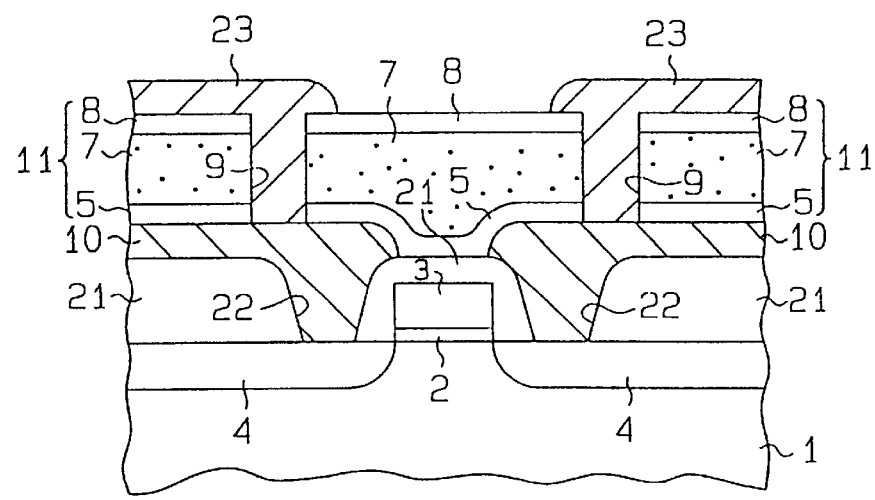

As shown in FIG. 5A, an upper silicon oxide film 8 is then formed on the modified SOG film 7 to complete an interlayer insulation film 11. Next, as shown in FIG. 5B, the interlayer insulation film 11 is subjected to anisotropic etching using a mixed gaseous system of carbon tetrafluoride and hydrogen to form via-contact holes 9 through these films 5, 7 and 8. Subsequently, as shown in FIG. 5C, an aluminum film is deposited by means of sputtering over the entire surface of the device with the bores of the via-contact holes 9 filled, and then subjected to anisotropic etching to form a wiring 23 having a desired pattern.

As described above, in the second embodiment, the wiring 23 is formed as a second wiring layer on the first wiring layer source and drain wiring 10 via the interlayer insulation film 11. The same advantages as in the first embodiment can be exhibited without affecting the MOS transistor and the first wiring layer.

Structure and Properties of the Modified SOG Film 7

The structure and properties of the modified SOG film 7 were examined, and the results will be described below.

The structure of the modified SOG film 7 was evaluated by means of FT-IR method (Fourier Transform Infrared Spectroscopy), SIMS method (Secondary Ion Mass Spectroscopy), ESR method (Electron Spin Resonance) and TDS method (Thermal Desorption Spectroscopy), and the evaluation results were discussed together with the evaluation results of plasma resistance, heat resistance and hygroscopicity. Electrical properties of the modified SOG film 7 were evaluated in the form of a MOS (Metal Oxide Semiconductor) capacitor, which was fabricated using aluminum electrodes, by means of high frequency CV (capacitance voltage) method.

Heat resistance, plasma resistance, water permeability and hygroscopicity were mainly evaluated with respect to stability of the film. Heat resistance was evaluated based on the change in the film thickness which was measured before and after a heat treatment in a nitrogen atmosphere. The released gas was analyzed by means of TDS, and the result was discussed compared with the change in the IR absorption spectrum (FT-IR spectrum) determined by means of FT-IR. Plasma resistance was evaluated based on the change in the film thickness and IR absorption spectrum which were measured before and after plasma exposure (under the resist ashing conditions). Hygroscopicity and water permeability were evaluated based on the change in the IR absorption spectrum which was measured before and after the film was left to stand in a clean room and also before and after a pressure cooker test (PCT). The film thickness of the SOG films 6 and 7 was evaluated by cross-sectional SEM (Scanning Electron Microscope) method. Electrical properties of the SOG films 6 and 7 were evaluated in the form of a MOS capacitor, which was fabricated on a (100) n-type monocrystalline silicon substrate using aluminum electrodes, by means of high frequency CV method (frequency: 1 MHz). The MOS capacitor was heat-treated after the formation of the aluminum electrodes in a forming gas ($H_2/N_2=1/9$) at 450° C. for 15 minutes.

[A] Change in the structure of the modified SOG film 7

A-1) Chemical bonds in the modified SOG film 7 (FT-IR)

Figure 6:
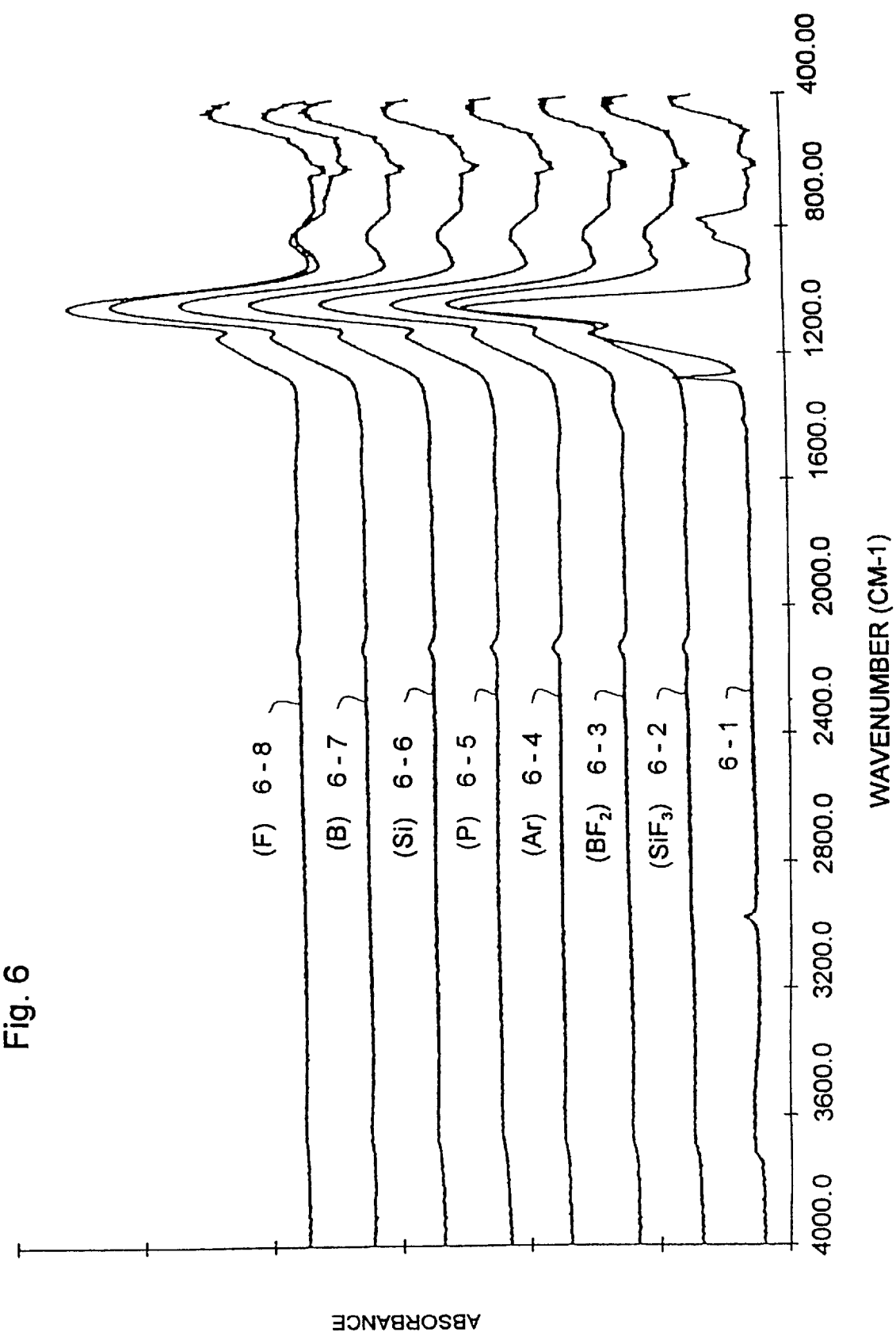
FIGS. 6 to 14, 15A, 15B and 16 to 20 are diagrams and graphs illustrating the characteristics of SOG films.

IR absorption spectra of the organic SOG films were measured by means of FT-IR immediately after implantation of various ions, and the results are shown in FIG. 6. The ion implantation was carried out with an acceleration energy of 140 keV and at a dose of $1\times10^{16}$ cm$^{-2}$, followed by heat treatment at 300° C. for 30 minutes. The same results were obtained even when the heat treatment after the ion implantation was omitted. In the IR absorption spectra of the modified SOG films 7 shown in FIG. 6, the graphs 6-1, 6-2, 6-3, 6-4, 6-5, 6-6, 6-7 and 6-8 are a spectrum of immediately after formation of the organic SOG pre-film 6 (before ion implantation); that of after implantation of silicon fluoride ($SiF_3$) ion; that of after implantation of boron fluoride ($BF_2$) ion; that of immediately after implantation of argon (Ar) ion; that of immediately after implantation of phosphorus (P) ion; that of immediately after implantation of silicon (Si) ion; that of immediately after implantation of boron (B) ion; and that of after implantation of fluorine (F) ion, respectively.

As the graph 6-1 shows, absorption peaks attributed to the organic components are observed at wave numbers of around 3000 cm$^{-1}$ and 1250 cm$^{-1}$ before the ion implantation. Incidentally, the absorption peak around 3000 cm$^{-1}$ is caused by the C—H bond stretching; whereas the absorption peak around 1250 cm$^{-1}$ is caused by the C—H bond deformation. However, as the graphs 6-2 to 6-8 show, no absorption peak is observed around 3000 cm$^{-1}$ and 1250 cm$^{-1}$ after the ion implantation. Further, as the graphs 6-2 to 6-8 show, it can be understood that the IR absorption spectrum of the modified SOG film 7 does not change depending on the ionic species implanted. Accordingly, it can be appreciated that the organic components contained in the organic SOG pre-film 6 is decomposed by the ion implantation. If water and hydroxyl groups are contained in the modified SOG film 7, absorption peaks attributed to the hydroxyl group should have been observed around 3600 cm$^{-1}$ and 930 cm$^{-1}$ like in the case of the film subjected to $O_2$ plasma treatment shown in FIG. 1. Generally, the absorption peak around 3600 cm$^{-1}$ is caused by the O—H bond stretching in H—OH and Si—OH; whereas the absorption peak around 930 cm$^{-1}$ is caused by the Si—O bond stretching in Si—OH. However, no such absorption peaks are observed in the graphs 6-2 to 6-8. Accordingly, it can be understood that the water and hydroxyl groups contained in the modified SOG film 7 are reduced immediately after the ion implantation compared with the organic SOG pre-film 6.

Figure 7:
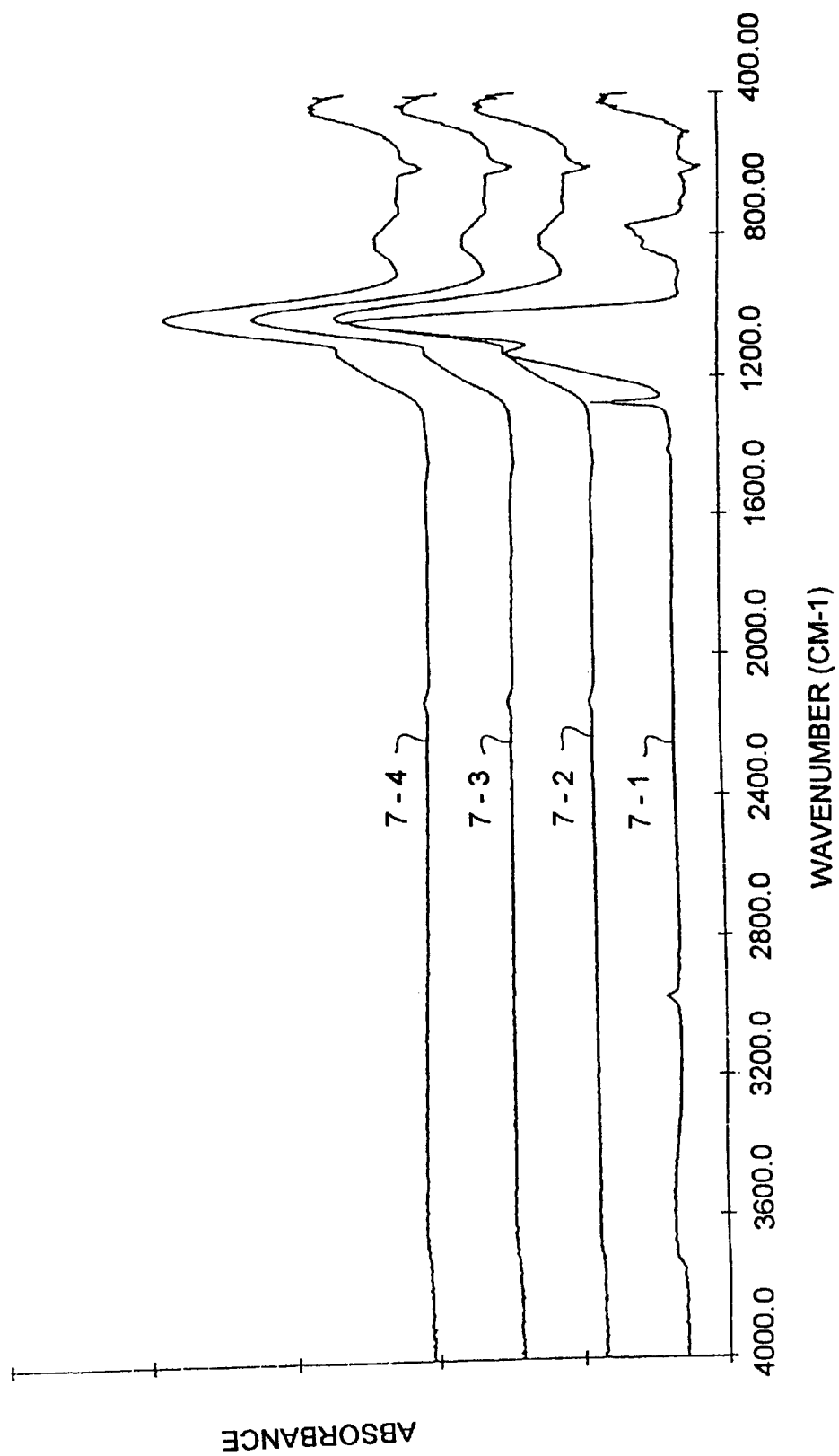

IR absorption spectra measured by means of FT-IR before and after ion implantation are shown in FIG. 7. The same conditions and the same ionic species as in FIG. 6 were used, and the IR absorption spectrum of the modified SOG film 7 did not change depending on ionic species. In the IR absorption spectra of the modified SOG films shown in FIG. 7, the graphs 7-1, 7-2, 7-3 and 7-4 are a spectrum of immediately after formation of the organic SOG pre-film 6; that of immediately after ion implantation; that of after one-day exposure under atmospheric condition in a clean room; and that of after 10-day exposure under atmospheric condition in the clean room, respectively.

Figure 1:
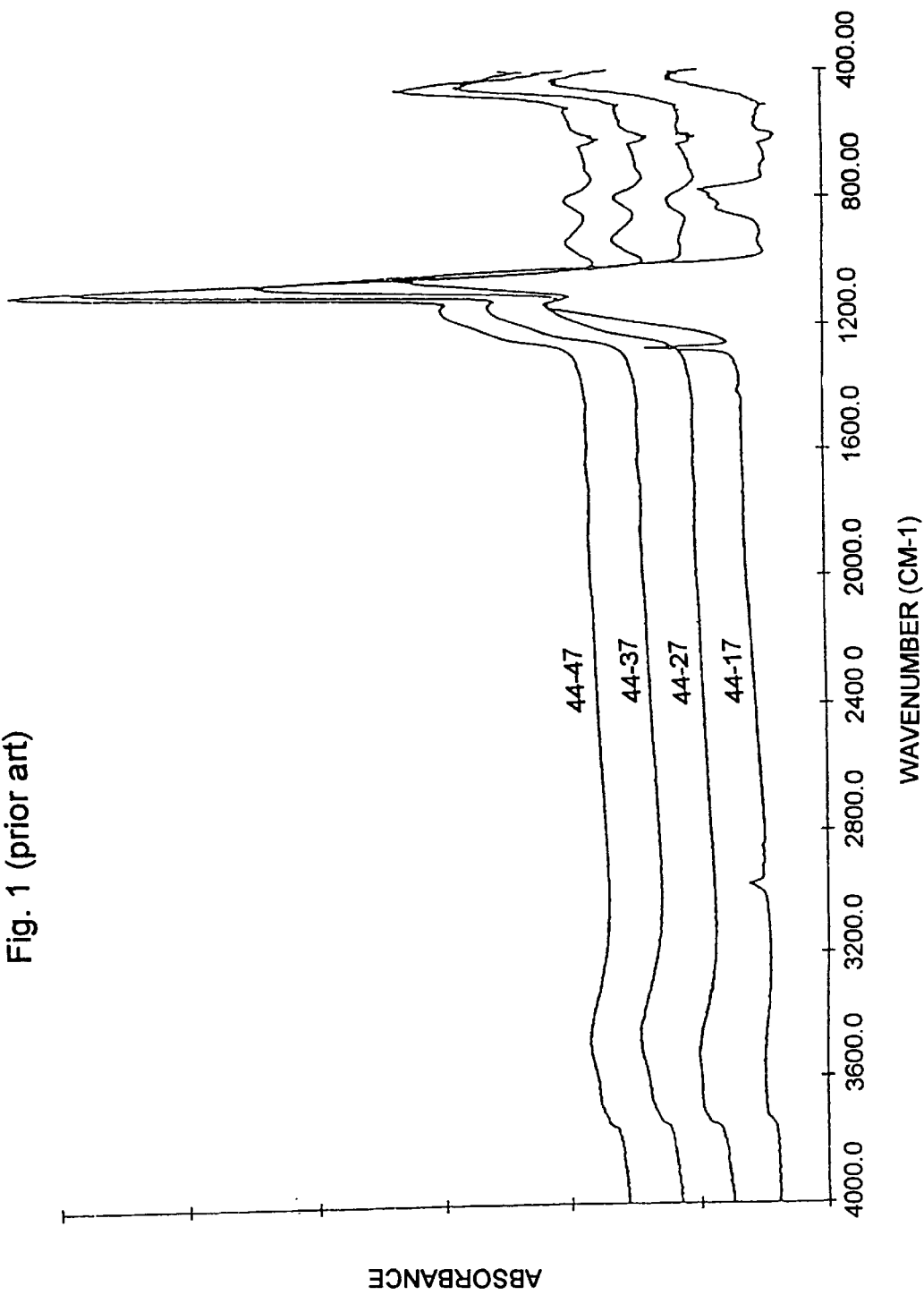
FIG. 1 shows IR absorption spectra of conventional organic SOG films.

As the graphs 7-2 to 7-4 shows, the absorption peaks around 3600 cm$^{-1}$ and 930 cm$^{-1}$ do not substantially increase with time after the ion implantation. Accordingly, it can be understood that the water and hydroxyl groups contained in the modified SOG film 7 do not increase with time. In contrast, the absorption peaks around 3600 cm$^{-1}$ and 930 cm$^{-1}$ increase with time in the organic SOG film subjected to the $O_2$ plasma treatment, as shown in FIG. 1. This shows that the modified SOG film 7 has a low hygroscopicity compared with the organic SOG film subjected to the $O_2$ plasma treatment.

Figure 8:
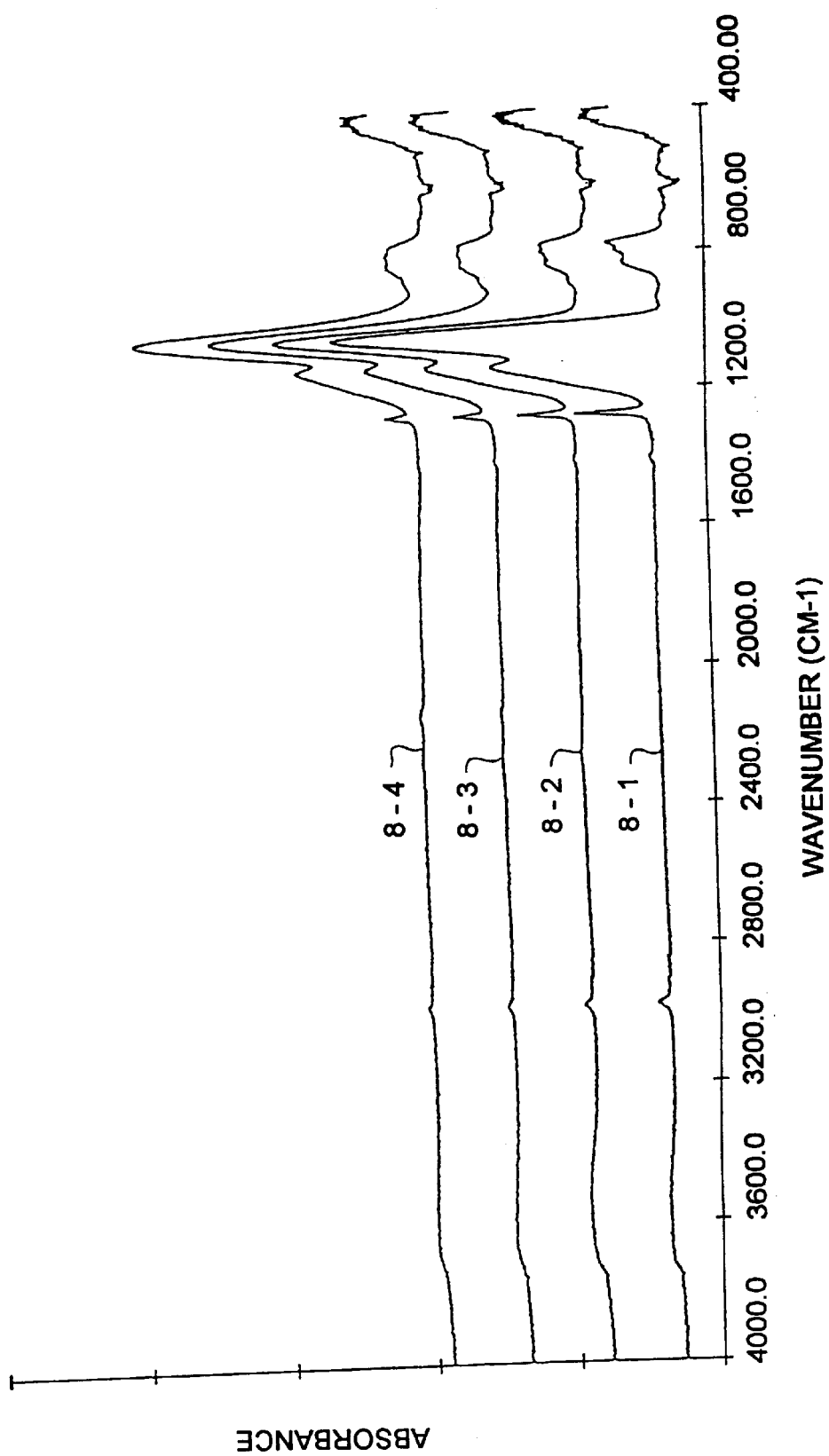
Figure 9:
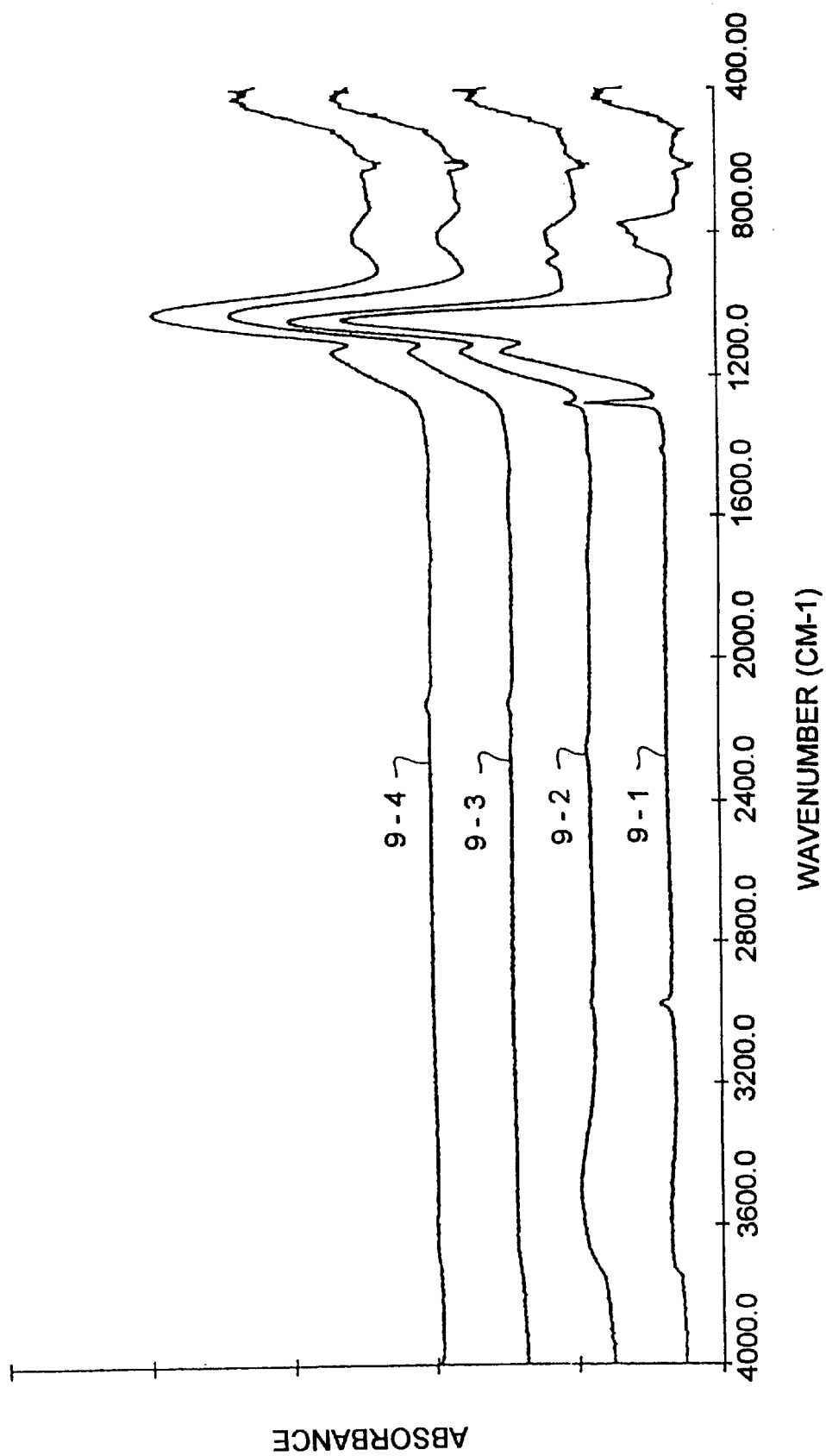

IR absorption spectra of the modified SOG films 7 measured by means of FT-IR are shown in FIGS. 8 and 9, in which the dose of the ion to be implanted to the organic SOG pre-films 6 was changed. The ion implantation was carried out with an acceleration energy of 30 keV in the case of FIG. 8; whereas with an acceleration energy of 140 keV in the case of FIG. 9. In both cases heat treatment was carried out after the ion implantation at 300° C. for 30 minutes. The same results were obtained even when the heat treatment after the ion implantation was omitted. Further, the same ionic species to be implanted as used in the case of FIG. 6 were used, and the IR absorption spectrum of the modified SOG film 7 did not change depending on the ionic species.

In the IR absorption spectra shown in FIGS. 8 and 9, the graphs 8-1 and 9-1 are spectra of immediately after formation of the organic SOG pre-film 6; the graphs 8-2 and 9-2 are those of modified SOG film 7 (dose: $1\times10^{14}$ cm$^{-2}$); the graphs 8-3 and 9-3 are those of modified SOG film 7 (dose: $1\times10^{15}$ cm$^{-2}$); and graphs 8-4 and 9-4 are those of modified SOG film 7 (dose: $1\times10^{16}$ cm$^{-2}$). As the graphs 8-1 to 9-4 show, the higher the ion dose, the smaller the absorption peaks around 3600 cm$^{-1}$ and 930 cm$^{-1}$. Accordingly, it can be understood that the water and hydroxyl groups contained in the modified SOG film 7 are reduced by increasing the dose of ion to be implanted. It should be noted that, in the case where the dose is $1\times10^{14}$ cm$^{-2}$, the amount of water and that of hydroxyl groups contained in the film are greater than in the organic SOG pre-film 6 immediately after formation. However, the percentage of increase is very small compared with that in the case of the plasma treatment as shown in FIG. 1.

As described above, since the water and hydroxyl groups contained in the organic SOG film 7 are not increased according to the embodiment of the present invention, defecs such as poisoned via phenomenon in the via-contact holes 9 can be prevented from occurring without providing the extra step of etching back the organic SOG pre-film 6. Therefore, according to the present invention, the production process can be simplified compared with the conventional technique where the organic SOG film is subjected to $O_2$ plasma treatment, and thus throughput can be improved.

Figure 17:
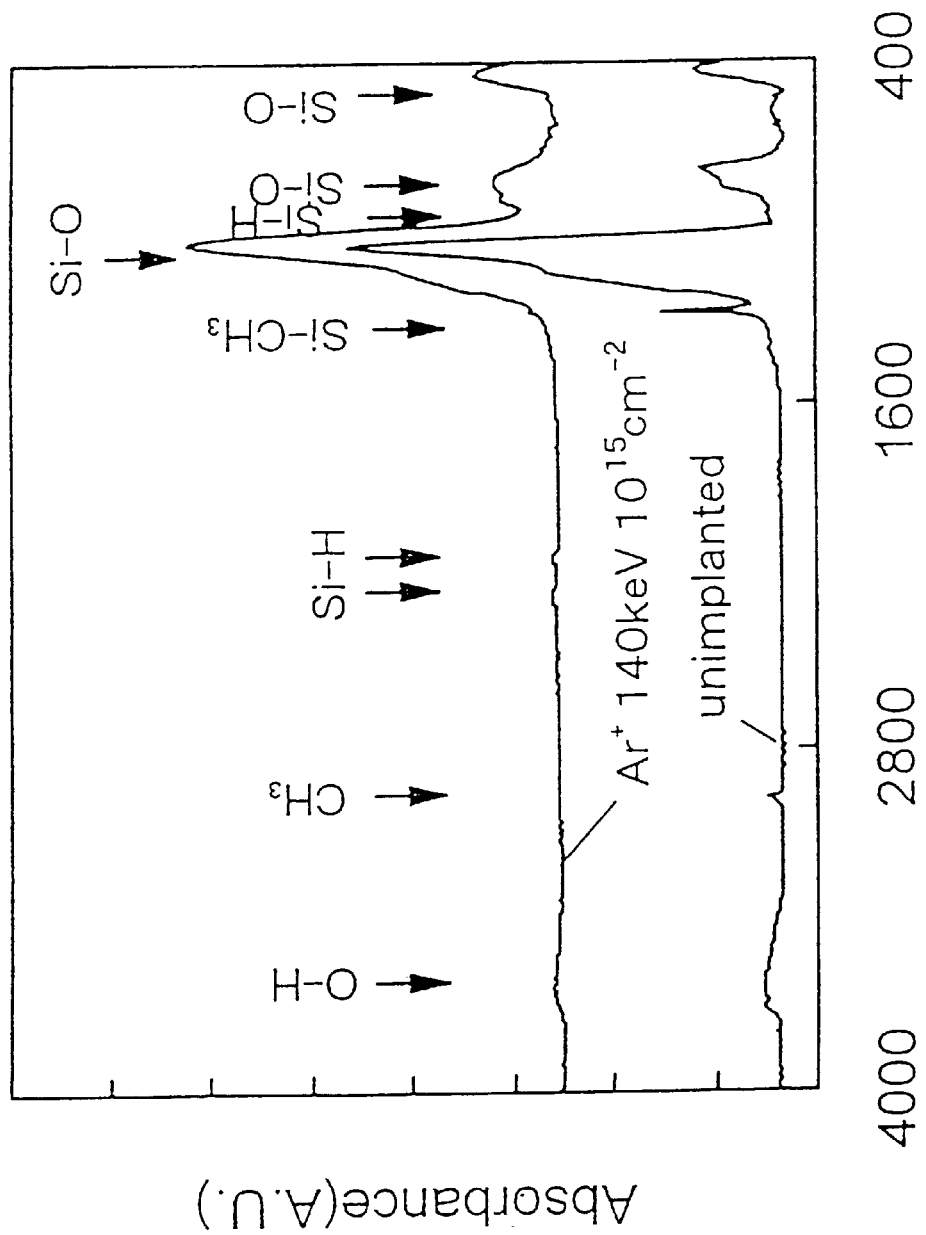

An IR spectrum measured by means of FT-IR immediately after implantation of Ar$^+$ ion to the organic SOG film 6 is shown in FIG. 17. The ion implantation was carried out with an acceleration energy of 140 keV and at a dose of $1\times10^{15}$ cm$^{-2}$. No absorption peaks attributed to —CH (around 3000 cm$^{-1}$) and to Si—$CH_3$ (around 1250 cm$^{-1}$) are observed in the modified SOG film 7. This suggests that the organic components in the organic SOG film 6 was decomposed. It can also be understood that the absorbance of O—H (around 3500 cm$^{-1}$) and that of Si—O (1100 cm$^{-1}$) did not change notably after the ion implantation. Since argon is inert, the impact energy of the implanted ion is considered to be the major factor in the above process. Further, as shown in FIG. 6, the same results were obtained when other ions were employed, and this suggests that the process which is not dependent on the ionic species implanted is the major factor. When focused on the bond energy of the chemical bonds contained in the organic SOG pre-film 6 (i.e., Si—O: 800 kJ/mol, Si—C: 450 kJ/mol, C—H: 338 kJ/mol, O—H: 428 kJ/mol), the bond energy of Si—O is twice as much as the other bonds. Consequently, it can be considered that cleavage did not occur notably in the Si—O bond but preferentially in the C—H bond. Further, it was found that new absorption peaks appear around 900 $cm^{-1}$ and 2100 to 2300 $cm^{-1}$ in the IR absorption spectrum of the modified SOG film 7. These peaks are considered to be attributed to the Si—H bond.

A-2) Carbon concentration (SIMS)

Figure 11:
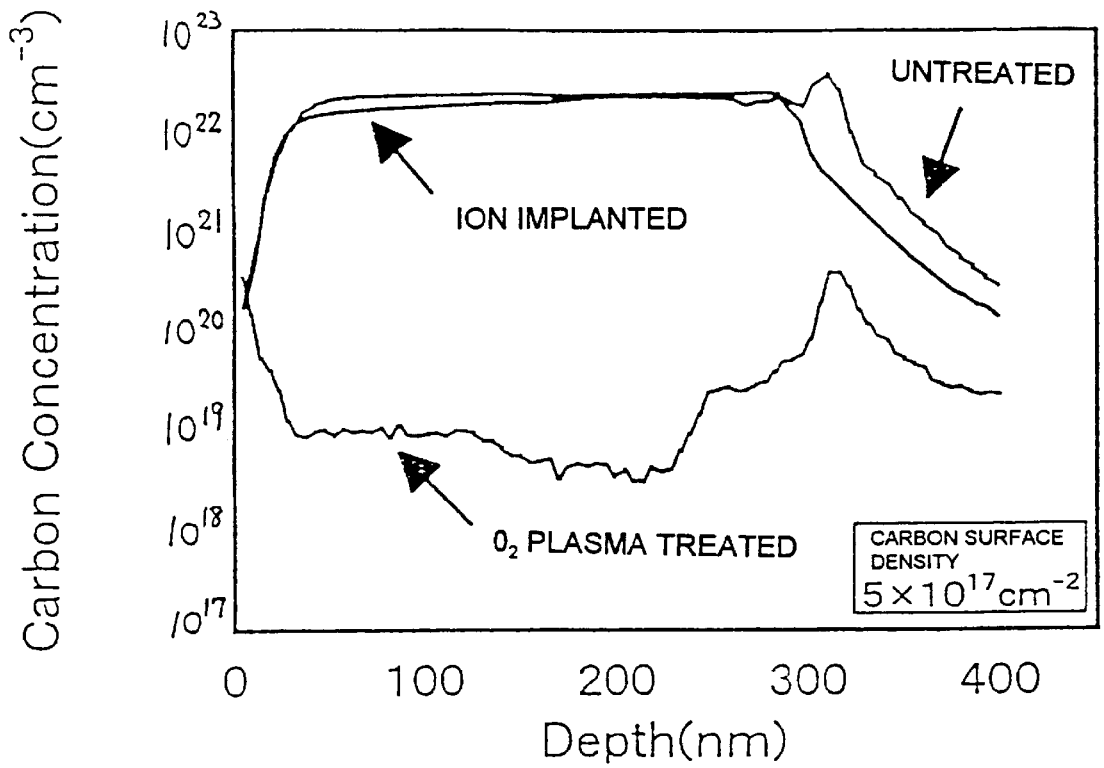

In order to examine if there are any organic components (particularly, carbon) formed when the organic component is decomposed by the ion implantation, depthwise distribution of carbon concentration was determined before and after the ion implantation by means of SIMS. The ion implantation was carried out with an acceleration energy of 140 keV and at a dose of $1\times10^{15}$ $cm^{-2}$. It was found from FIG. 11 that most of the carbon atoms remain in the film even after decomposition of the organic components as mentioned in the paragraph A-1. It was also found that the film has uniform carbon concentration and that there is no depth-dependent change in the distribution after the ion implantation. This suggests that the carbon atoms are not converted to volatile compounds but remain as such in the film. It was also confirmed that the distribution of carbon concentration does not change when other ions (e.g., fluorine and nitrogen) were implanted, but the carbon atoms remain as such in the film. The ratio of average numbers of atoms contained in the organic SOG film 6 was determined by RBS (Rutherford Back Scattering) method to be O/Si=1.67; C/Si=0.3; whereas in the modified SOG film 7 to be O/Si=1.72; C/Si=0.3. In contrast, it has been already reported that, when the organic SOG film 6 is modified by means of $O_2$ plasma treatment, the amount of carbon atoms contained in the film 6 decreases to about $1\times10^{19}$ $cm^{-3}$ (which was $5\times10^{22}$ $cm^{-3}$ before the plasma treatment) [see C. K. Wang, L. M. Liu, H. C. Cheng, H. C. Huang, M. S. Lin, Proc. of IEEE VMIC, p.101 (1994)]. Most of the carbon atoms remain in the modified SOG film 7 subjected to the ion implantation, the film 7 is expected to exhibit properties which are not exhibited by the film subjected to the $O_2$ plasma treatment.

A-3) Dangling bond (ESR)

Figure 12:
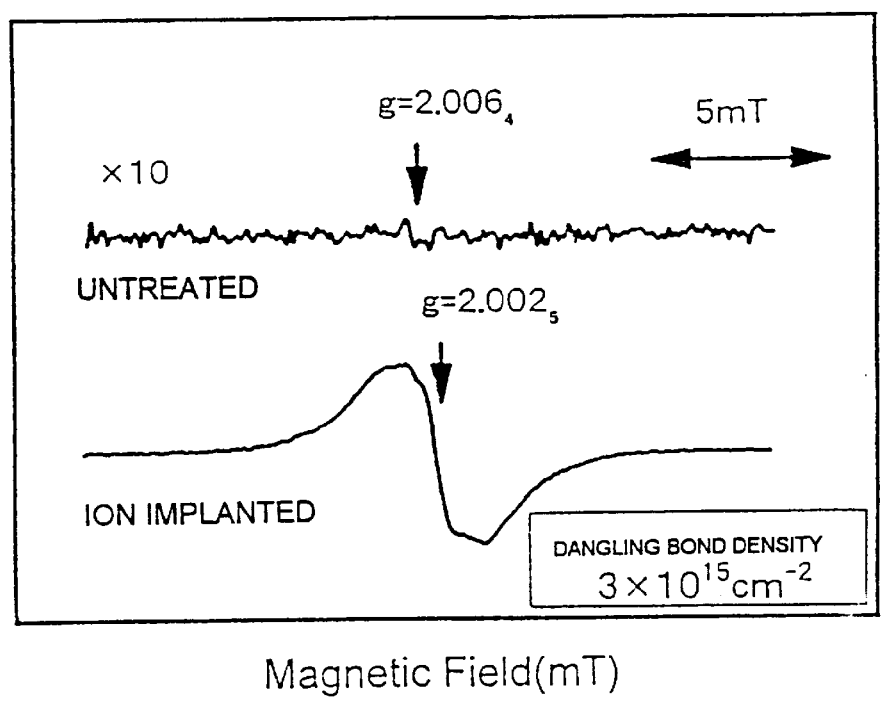

Dangling bonds in the organic SOG film immediately after the $Ar^+$ implantation were measured by means of ESR, and the results are shown in FIG. 12. The ion implantation was carried out with an acceleration energy of 140 keV and at a dose of $1\times10^{15}$ $cm^{-2}$. No dangling bond was observed on the organic SOG film 6 except the Pb center (g=2.0064) present on the surface of the substrate. Surface density of the Pb center was $3.2\times10^{12}$ $cm^{-2}$. In the modified SOG film 7, carbon dangling bond (g=2.0025) can be observed. The surface density of the carbon dangling bond was $3.0\times10^{15}$ $cm^{-1}$ When the carbon concentration shown in FIG. 11 was integrated depthwise, the carbon surface density was $5\times10^{17}$ $cm^{-2}$. Since a carbon atom has a valence of 4, if all of the carbon valences remain unbonded, there are $2\times10^{18}$ $cm^{-2}$ of carbon dangling bonds. However, since the surface density of the carbon dangling bonds actually measured was $3.0\times10^{15}$ $cm^{-2}$, it can be concluded that 99.85% of the carbon valences in the film are bound to the atoms present in the film (i.e., hydrogen, oxygen, carbon and silicon). Further, since no absorption attributable to carbon-hydrogen bond is observed in FIG. 17, the carbon atoms are supposed to be bonded with carbon, silicon or oxygen.

[B] Stability of the modified SOG film 7

B-1) Heat resistance

Figure 13:
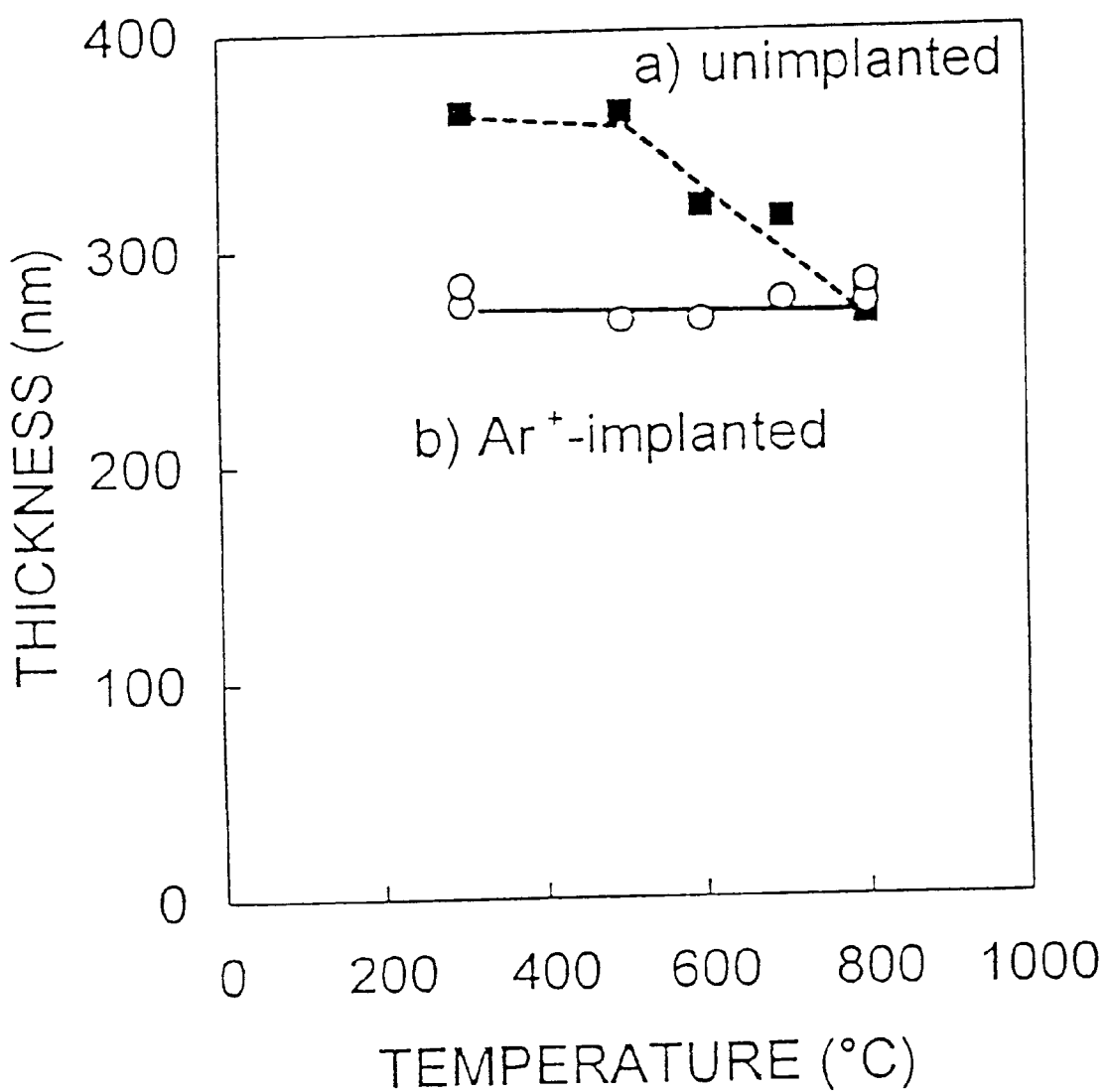

As an index of heat resistance, loss in the thickness of the modified SOG film 7 was evaluated. FIG. 13 shows changes in the film thickness when the modified SOG film 7 obtained by subjecting the organic SOG pre-film 6 to $Ar^+$ implantation was heat-treated in a nitrogen atmosphere for 30 minutes. The ion implantation was carried out with an acceleration energy of 140 keV and at a dose of $1\times10^{15}$ $cm^{-2}$. When the organic SOG film 6 was heat-treated, the film thickness was reduced as heat treatment temperature rises. Such loss in the film thickness is supposed to be densification of the film which occurs with the rise in the heat treatment temperature. In contrast, the film thickness of the modified SOG film 7 was not reduced even when it was heat-treated at 800° C. The thickness of the modified SOG film 7 is substantially the same as that of the organic SOG film 6 heat-treated at 800° C. This shows that the modified SOG film 7 is densified to the same level as achieved when the organic SOG film 6 is heat-treated at 800° C.

B-2) Characteristics of heat eliminable gas

Figure 14:
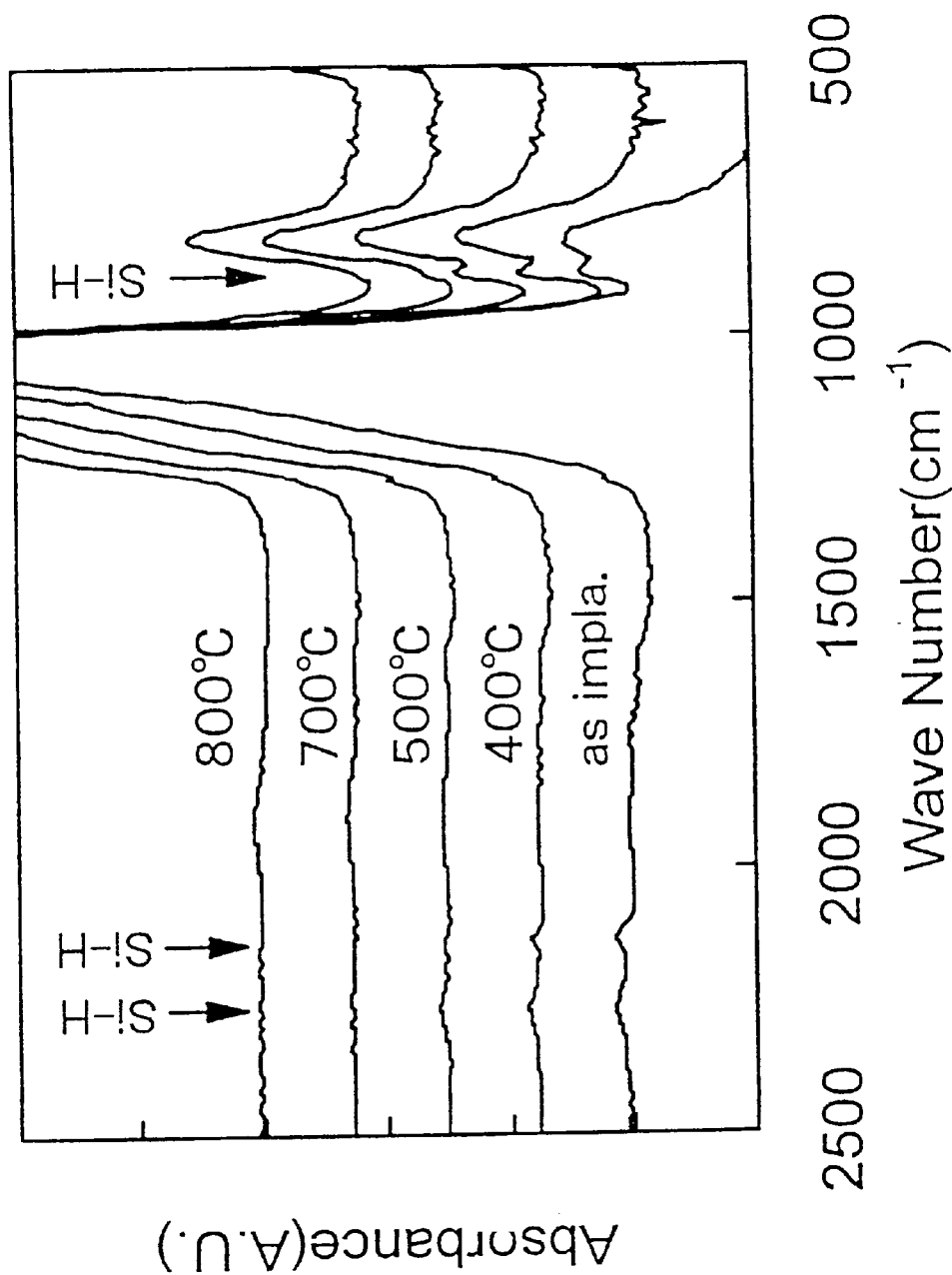
Figure 15A:
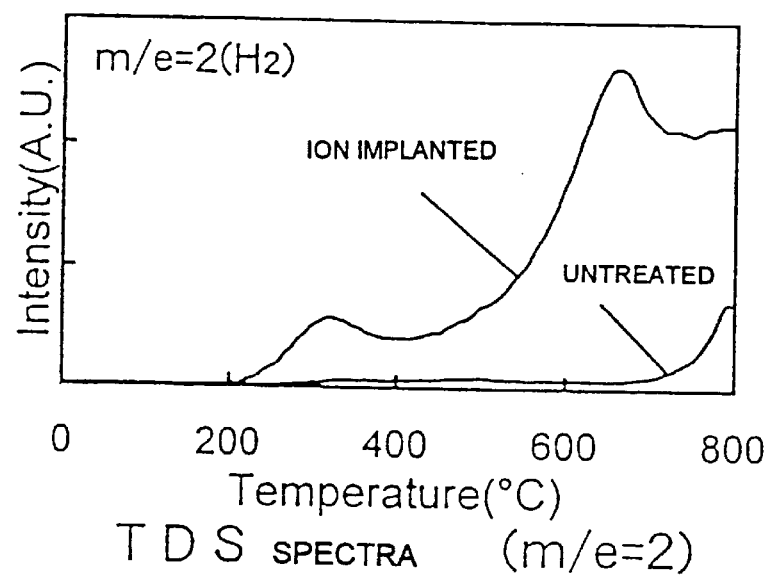
Figure 15B:
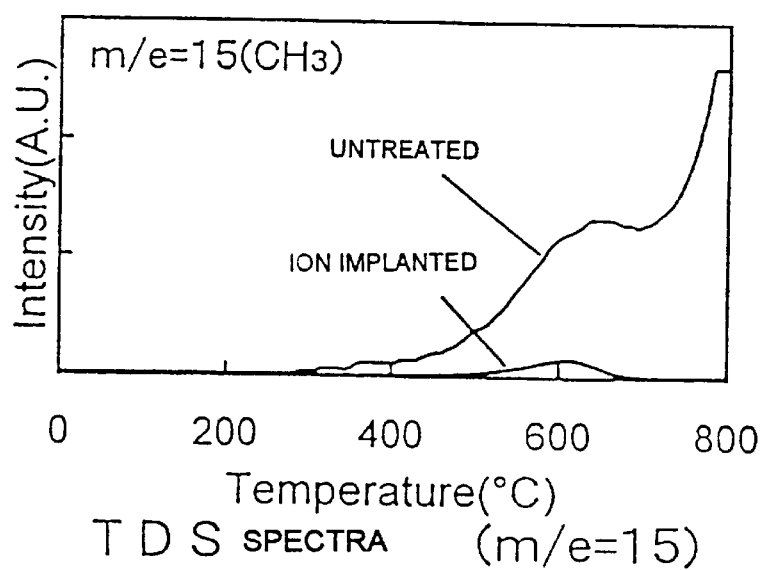

The modified SOG film 7 obtained by subjecting the organic SOG film 6 to $Ar^+$ implantation was subjected to heat treatment in a nitrogen atmosphere for 30 minutes and evaluated by means of FT-IR, and the results are shown in FIG. 14. It can be understood that, in the heat treatments at 400° C. or higher, the absorption peaks (around 900 $cm^{-1}$ and 2100 to 2300 $cm^{-1}$) which are supposed to be attributable to Si—H bond are reduced gradually with the temperature rise. The modified SOG film 7 was heat-treated in a nitrogen atmosphere for 30 minutes and evaluated by means of TDS, and the results are as shown in FIGS. 15A and 15B. The ion implantation was carried out with an acceleration energy of 140 keV and at a dose of $1\times10^{15}$ $cm^{-2}$. In the heat treatments at 400° C. or higher, liberation of hydrogen was observed. Since behaviors of the absorption peak tend to coincide with that of the absorption peak which is supposed to be attributable to the Si—H bond, observed by the FT-IR method, the hydrogen dissociated from the Si—H bond seems to have been observed by the TDS analysis. Consequently, the absorption peaks around 900 $cm^{-1}$ and 2100 to 2300 $cm^{-1}$ are attributable to the Si—H bond.

It is considered that the hydrogen atoms dissociated by the ionic impact concern much in the process that the Si—H bond is formed by the ion implantation. Such hydrogen atoms include (1) those dissociated from the carbon atoms constituting the methyl groups and (2) those dissociated from the Si—OH bond or $H_2O$. It can be considered that the silicon dangling bonds formed by dissociation of oxygen and carbon are terminated by the hydrogen atom (1) or (2).

Further, on comparing the modified SOG film 7 with the organic SOG film 6 by means of TDS, m/e relative strength values in the modified SOG film 7 are: $H_2$ (m/e=2) 13; $CH_x$ (m/e=15) 0.1; $H_2O$ (m/e=18) 0.1; CO (m/e=28) 2.4; $CO_2$ (m/e=44) 2.5. Meanwhile, m/e relative strength values in the organic SOG film 6 are 1.0 common to $H_2$, $CH_3$, $H_2O$, CO and $CO_2$. As the data show, in the modified SOG film 7, the amount of released gas associated with $H_2O$ (m/e=18) and $CH_x$ (m/e=14,15) is smaller, while that associated with Hz (m/e=2) and $COX$ (m/e =28, 44) are greater.

B-3) Plasma resistance

Figure 16:
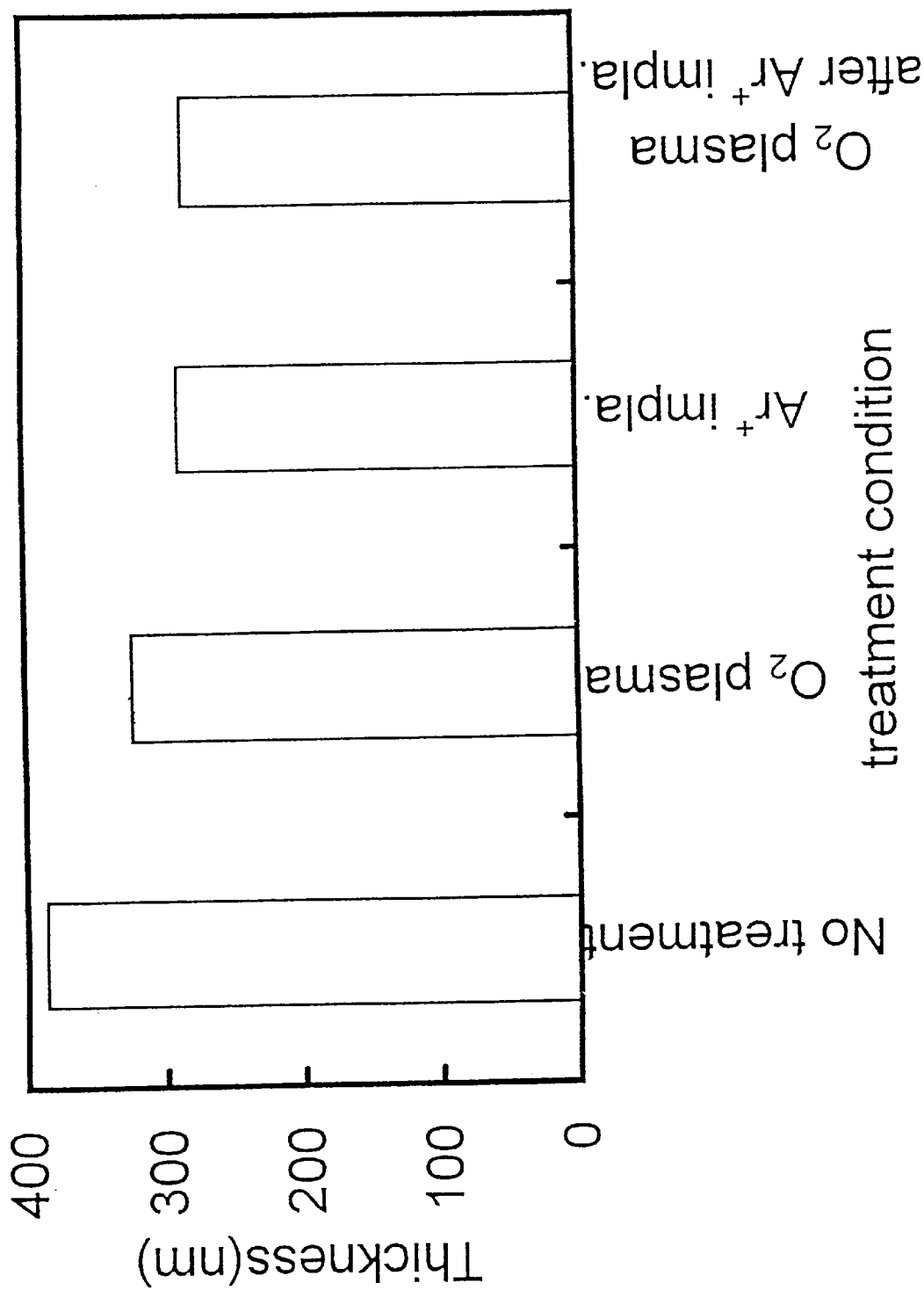

As an index of $O_2$ plasma resistance, loss in the thickness of the modified SOG film 7 was evaluated. FIG. 16 shows changes in the film thickness when the modified SOG film 7 formed by implanting $Ar^+$ to the organic SOG pre-film 6 was exposed to $O_2$ plasma. The ion implantation was carried out with an acceleration energy of 140 keV and at a dose of $1\times10^{15}$ cm$^{-2}$. It was found that, when the organic SOG film 6 was exposed to O$_2$ plasma, the film thickness decreased 16%, and that, when the modified SOG film 7 was exposed to O$_2$ plasma, the film thickness did not decrease. However, the thickness of the modified SOG film 7 is reduced byr 25% compared with that of the organic SOG film 6. The above results demonstrate that, when ion implantation was carried out under the condition such that the organic components may decompose, the organic SOG film is modified to a film having excellent O$_2$ plasma resistance. Further, since the loss in the film thickness is greater in the ion-implanted film than in the O$_2$ plasma-exposed film, it can be considered that the ion-implanted film has higher density over the other.

Figure 10:
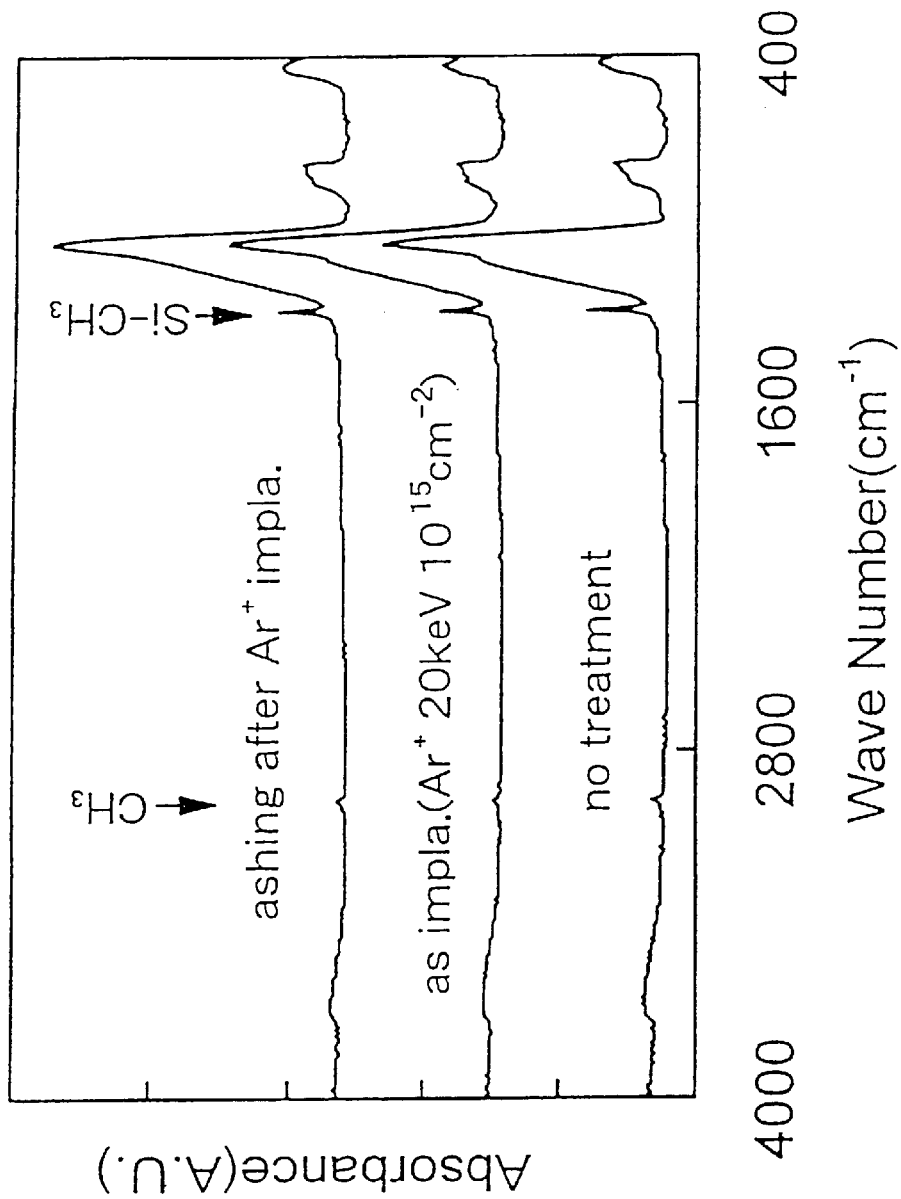

Next, ashing resistance when only the film surface was modified by the ion implantation was evaluated. IR absorption spectrum was measured by means of FT-IR before and after the ashing treatment, and the results are as shown in FIG. 10. The ashing was carried out under the conditions such that a resist having a film thickness of 10 μm can be removed using a microwave down-flow apparatus. As FIG. 10 shows, it was found that the internal portion of the organic SOG film remained unmodified when Ar$^+$ was implanted with an implantation energy of 20 keV. It was also found that, if such sample is subjected to ashing treatment, the amount of methyl groups in the unmodified portion of the organic SOG film 6 does not change. Consequently, ashing resistance can be improved even in such regions as the ion doping depth is shallow.

B-4) Water permeability and hygroscopicity

Generally, the organic components in the organic SOG film 6 is decomposed when the film 6 is exposed to O$_2$ plasma. It is already reported in such cases that the water content of the film increases and that IR absorbance attributed to Si—O increases (see C. K. Wang, L. M. Liu, H. C. Cheng, H. C. Huang and M. S. Lin, Proc. of IEEE VMIC, p.101 (1994)).

Figure 18:
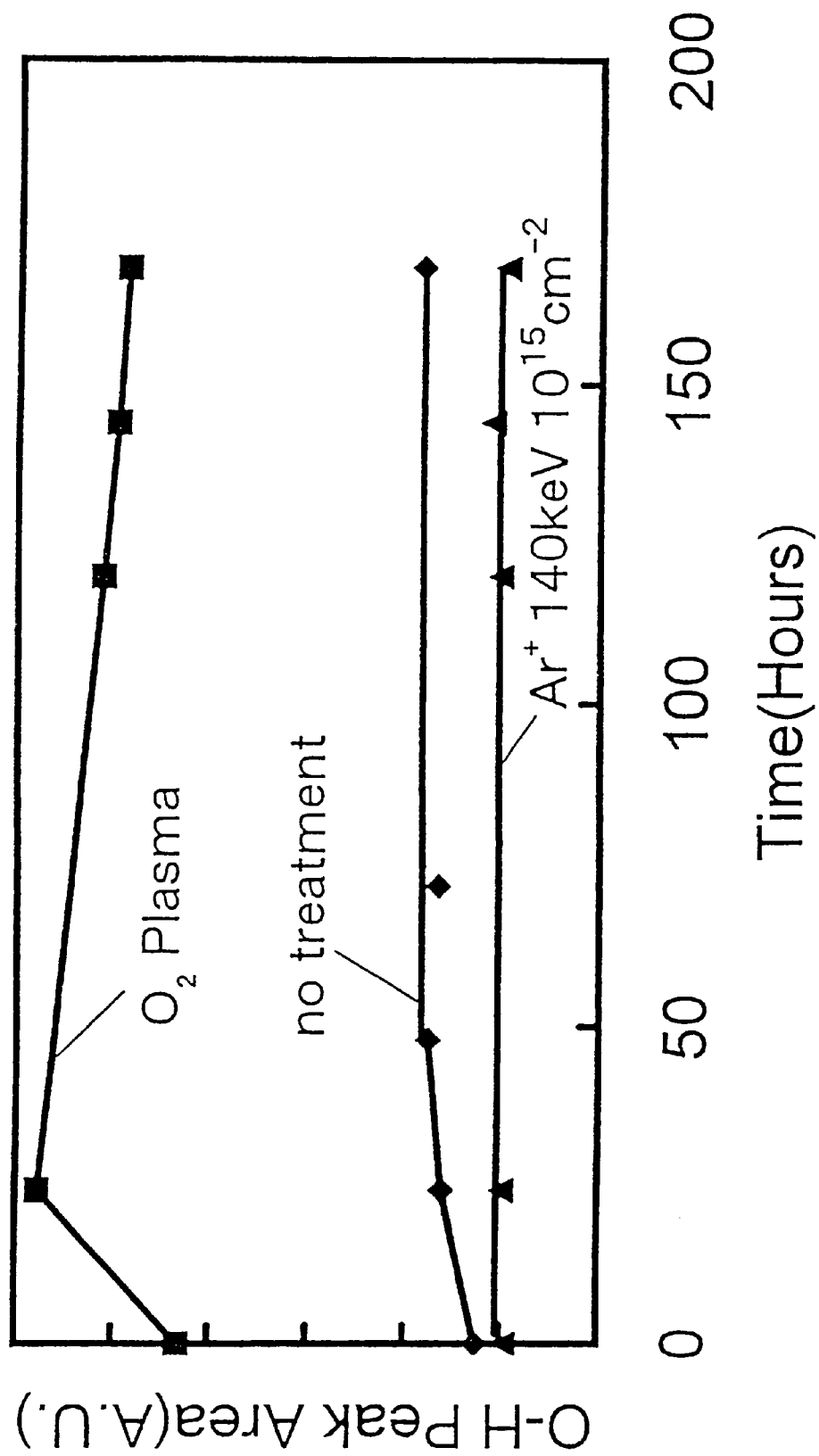

Hygroscopicity of the modified SOG film 7 by ion implantation is compared with that of the organic SOG film 6 modified by O$_2$ plasma exposure as well as that of the unmodified organic SOG film 6. Water content in the respective films was measured before and after the modification treatments and after the modified films were left to stand under atmospheric condition in a clean room. The results are as shown in FIG. 18. The water content of each film is indicated by the integrated intensity of the absorption (around 3500 cm$^{-1}$) attributed to the O—H bond in the IR absorption spectrum. The ion species used here was argon and was implanted at an energy of 140 keV. It can be understood that, when the film was exposed to O$_2$ plasma, the water content increased not only after the treatment but also after one day. In the ion-implanted film, the water content did not increase after the treatment, and the increase in the water content is small even when it was left to stand under atmospheric condition in a clean room. Additionally, the ion-implanted film showed lower hygroscopicity than that of the unmodified film.

The reasons why the hygroscopicity of the modified film 7 may be low are as follows:

(1) The modified film 7 contains many Si—H bonds, as described in the paragraph B-2 (see M. Doki, H. Watatani and Y. Furumura, Proc. of IEEE VMIC, p.235 (1994)).

(2) The modified film 7 has the highest density and also has a fine structure, as described in the paragraphs B-1 and B-3 (see Shimokawa, Usami, Tokifuji, Hirashita and Yoshimaru, Shingaku-giho, Vol.92, No.369, p.89, SDM92-133 (1992)).

Figure 19:
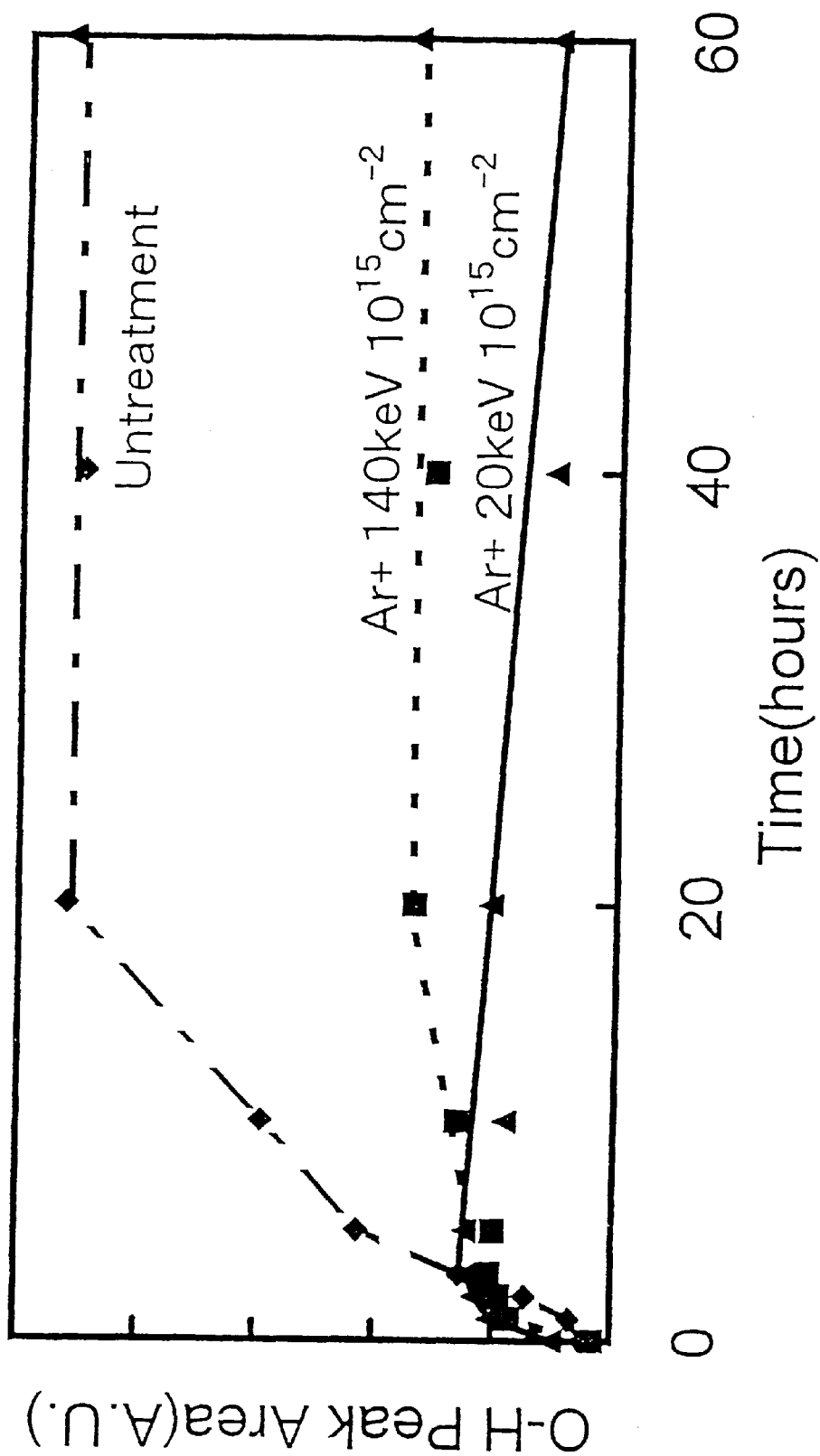

The modified SOG film 7 was subjected to PCT (at 120° C., under 2 atm. saturated vapor atmosphere) so as to examine water permeability of the film 7, and the results are shown in FIG. 19. Integrated intensity of the absorption peak (around 3500 cm$^{-1}$) associated with the O—H bond in the organic SOG film 6 was determined by means of FT-IR, and plotted with respect to the treatment time. A sample modified on the electrode surface by means of ion implantation (Ar$^+$, 20 keV) was prepared, which was compared with a sample modified throughout the film (Ar$^+$, 140 keV) and an unmodified sample to obtain the following results.

(1) When the unmodified organic SOG film 6 was subjected to PCT, the absorbance around 3500 cm$^{-1}$ (attributed to O—H bond) showed a steep increase.

(2) In the modified film, increase in the absorbance around 3500 cm$^{-1}$ (attributed to O—H) is small. The surface-modified film also showed similar level of increase to the modified film.

(3) Since the surface-modified film contains unmodified internal portion, it is expected to undergo such change as described in (1) if water is allowed to reach the unmodified internal portion of the film by the PCT. However, the change was small within the time period of the PCT (60 hours). From these results, it can be considered that a layer which inhibit permeation of water was formed by the ion implantation.

[C] Electrical properties (dielectric constant)

Figure 20:
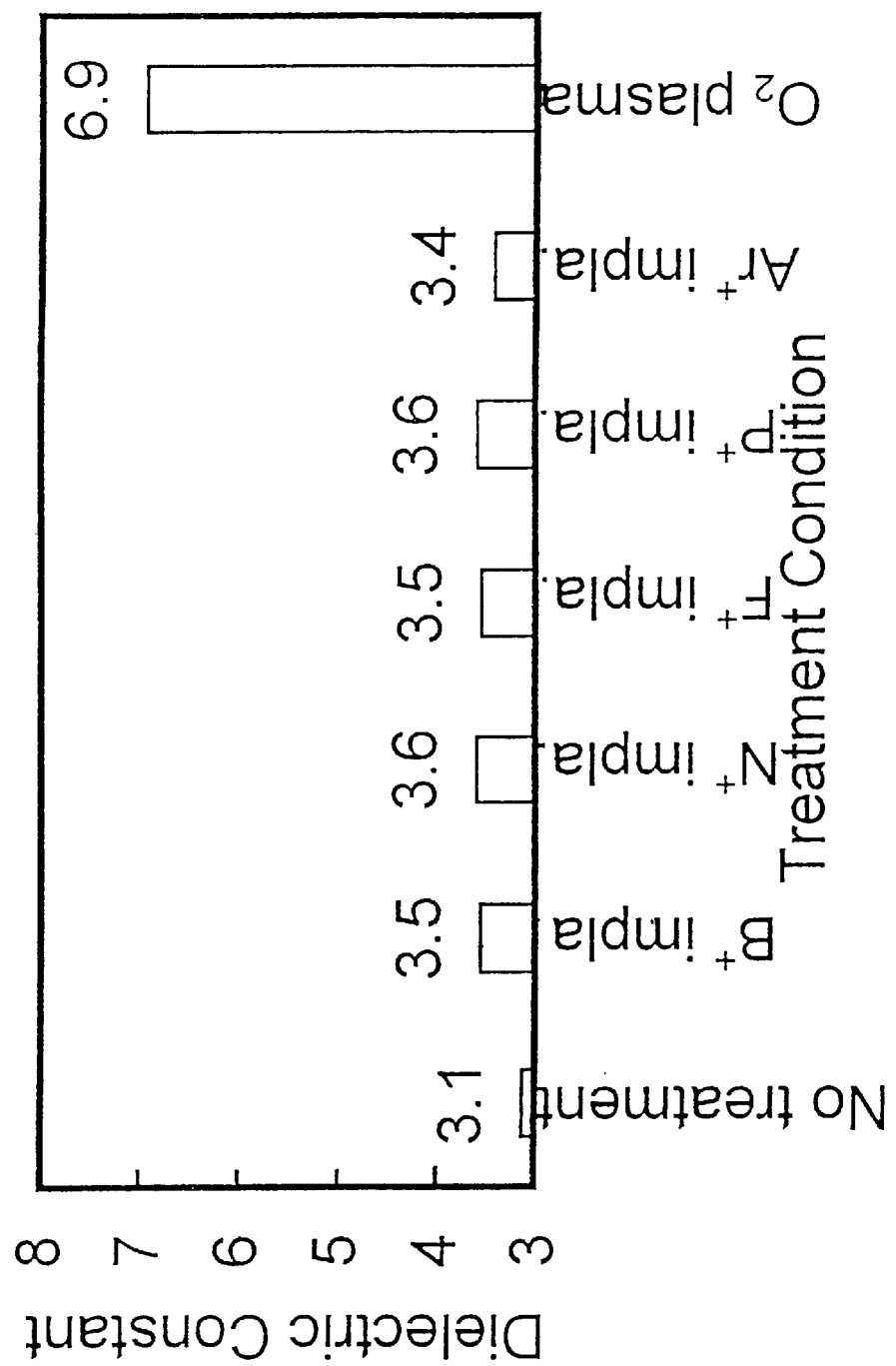

Relative dielectric constant was calculated based on the accumulative capacitance of MOS capacitor and on the film thickness obtained by cross-sectional SEM observation. The results of the calculation are shown in FIG. 20. The organic SOG film 6 showed a relative dielectric constant of 3.1, while the O$_2$ plasma-treated organic SOG film subjected to no ion implantation showed a high relative dielectric constant (6.9). This is because the latter film contains a large amount of water (see K. Murase, Jpn. J. Appl. Phys., Vol. 33, p.1385 (1994)). On the other hand, any of the modified SOG films 7 subjected to ion implantation (B$^+$, N$^+$, F$^+$, P$^+$ or Ar$^+$) showed a relative dielectric constant of about 3.5. The data suggest that these ionic species were not assuming electrically active state. The reason why the modified SOG films 7 were caused to show relatively low dielectric constant is not known.

[D] Via-Contact hole profile

Figure 21:
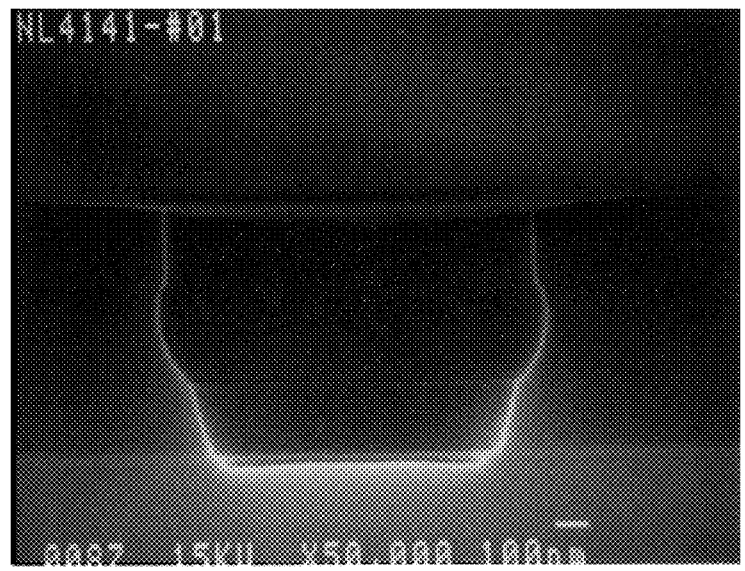
FIGS. 21 to 26 are micrographs showing cross sections of SOG films.
Figure 22:
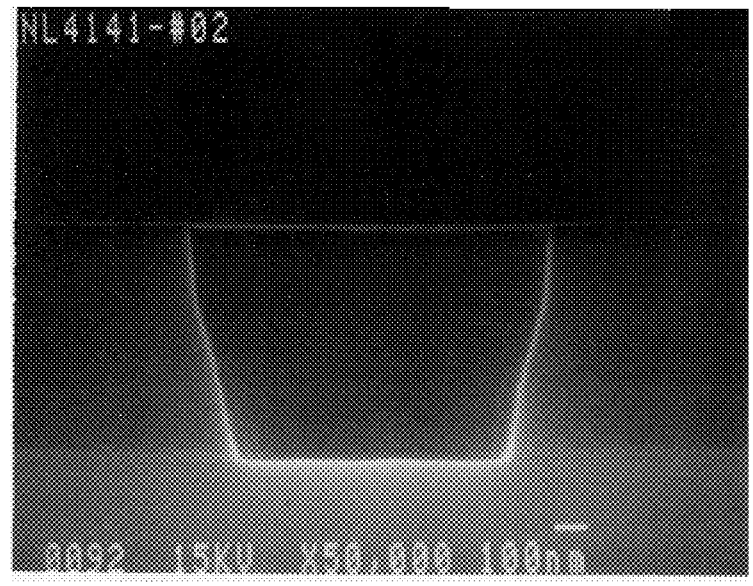
Figure 23:
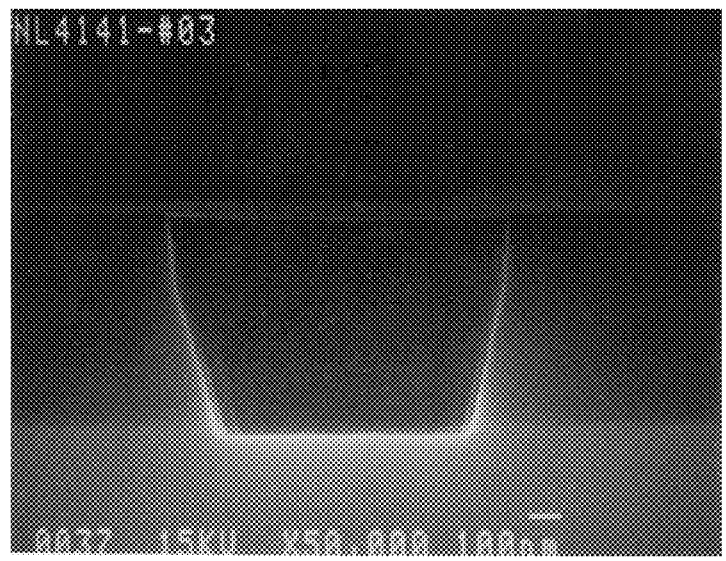
Figure 24:
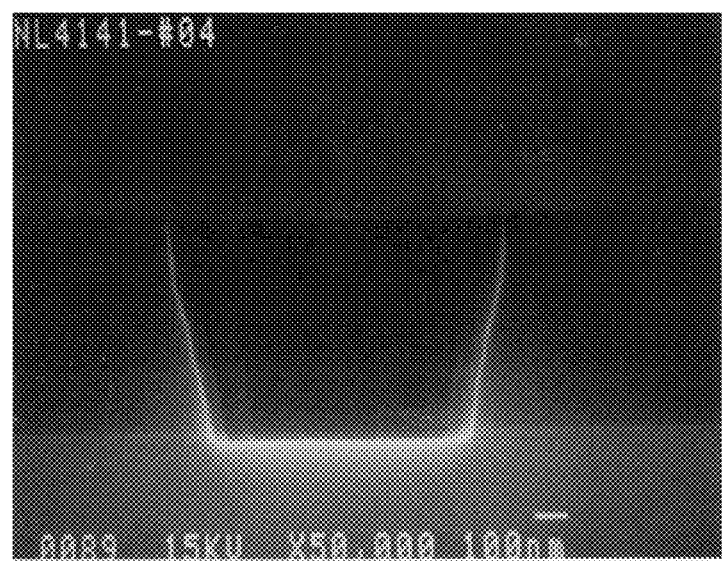
Figure 25:
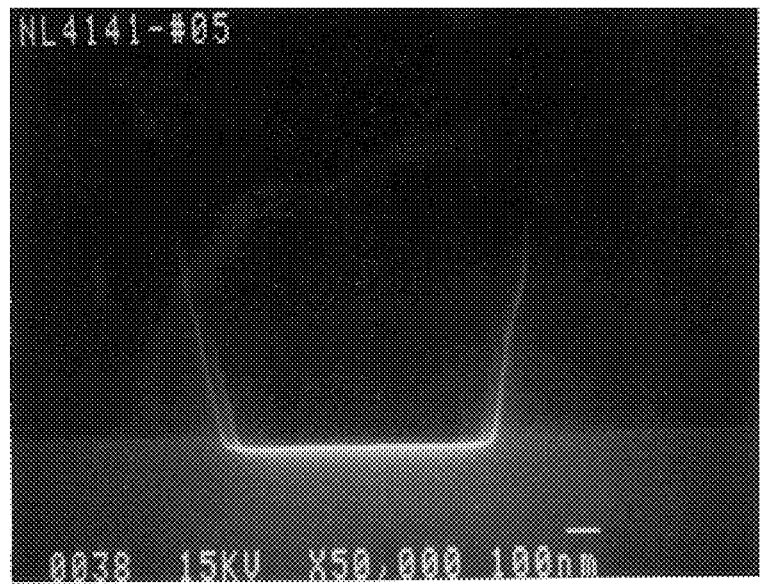
Figure 26:
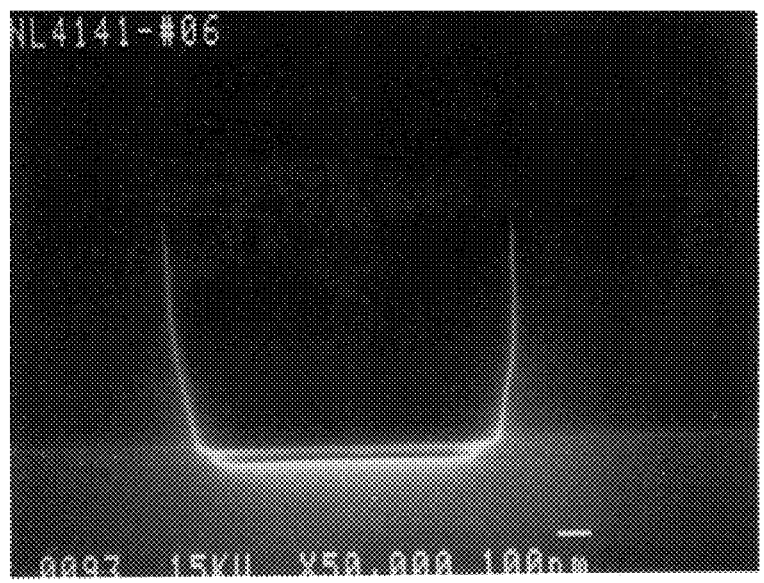
Figure 27B:
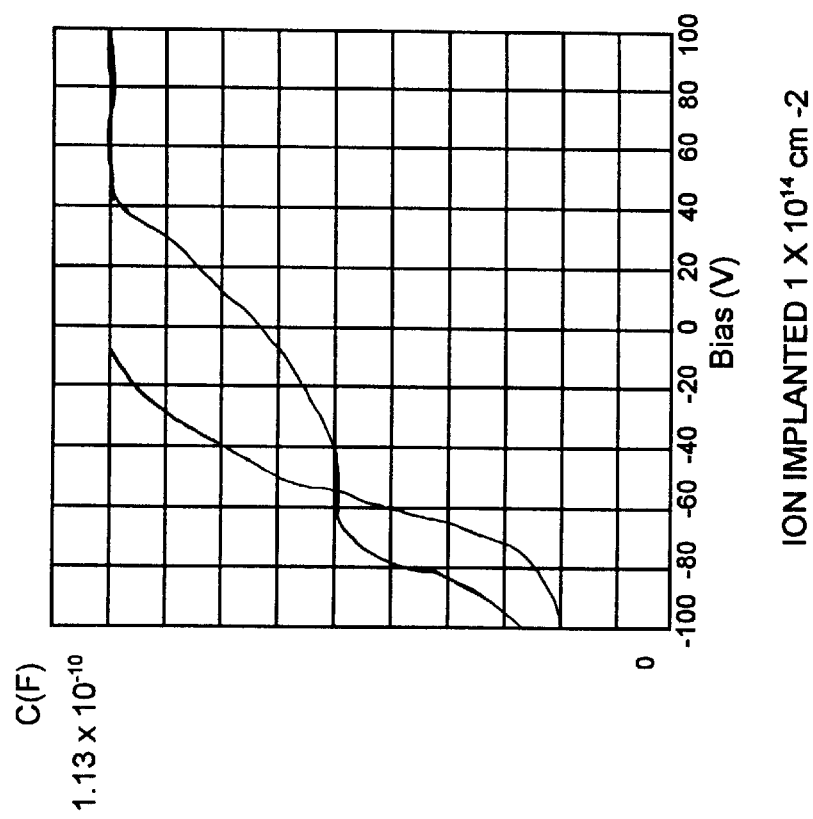
Figure 27A:
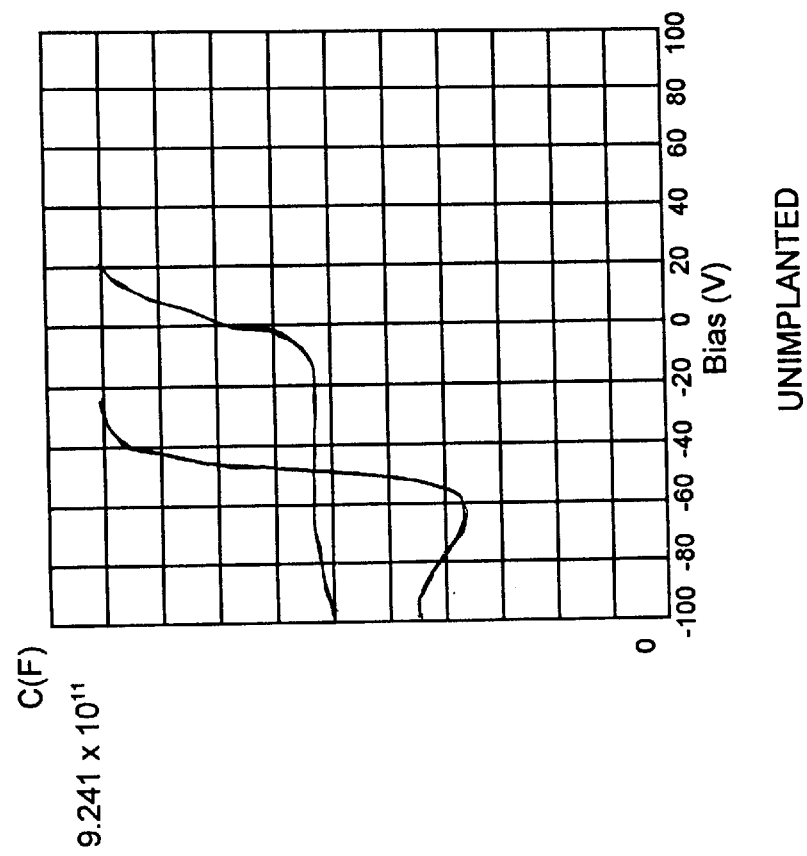
Figures 28A, 28B:
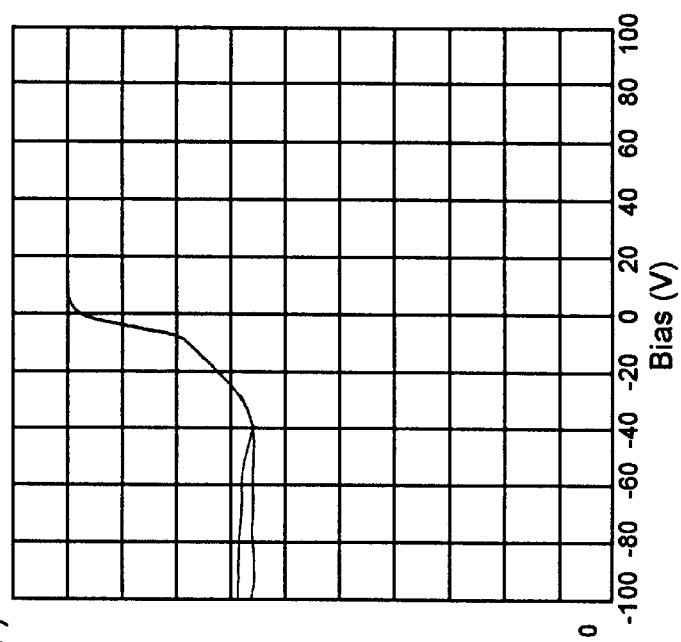

FIG. 21 to 26 are microscopic photographs showing cross-sectional profiles of via-contact holes 9 observed by cross-sectional SEM. FIG. 21 is of an organic SOG film 6 subjected to no ion implantation; FIG. 22 is of an organic SOG film implanted with fluorine ion (acceleration energy: 100 keV, dose: $1\times10^{15}$ cm$^{-2}$); FIG. 23 is of an organic film implanted with nitrogen ion (acceleration energy: 80 keV, dose: $1\times10^{15}$ cm$^{-2}$); FIG. 24 is of an organic film implanted with argon ion (acceleration energy: 140 keV, dose: $1\times10^{15}$ cm$^{-2}$); FIG. 25 is of an organic film implanted with phosphorus ion (acceleration energy: 140 keV, dose: $1\times10^{15}$ cm$^{-2}$); and FIG. 26 is of an organic film 6 subjected to O$_2$ plasma treatment under the same conditions as in FIG. 1.

As shown in FIG. 21, recesses are formed on the inner walls of the via-contact holes of the untreated organic SOG film 6. However, as shown in FIGS. 22 to 25, no recess is formed in the ion-implanted organic SOG films like in the case of the O$_2$ plasma-treated organic SOG film shown in FIG. 26. These observation suggests that the modified SOG films 7 contain no organic components consisting essentially of hydrocarbon, and that the implantation of nitrogen ion also exhibits the same effect as in the cases of the other ions.

The discussions of [A] to [D] with respect to the structure of the modified SOG films 7 will be summarized as follows:

(1) The C—H bonds decrease;

(2) Decrease of Si—O bonds is relatively small;

(3) Si—H bonds are present;

(4) Free carbon atoms remain in the film;

(5) Most of the dangling bonds present in the film are of carbon origin; and (6) The number of dangling bonds is smaller by about two figures than that of carbon atoms contained in the film.

Stability of the modified SOG films 7 was compared with that of the unimplanted organic SOG film 6 to find the following:

(1) Referring to heat resistance, loss in the film thickness is small up to about 800° C. The amounts of liberated water and $CH_x$ are small at high temperatures. However relatively large amounts of hydrogen and carbon oxides are liberated.

(2) No film shrinkage occurs even when the films are exposed to plasma (particularly, under the resist ashing conditions).

(3) The modified films have low hygroscopicity and low water permeability.

The following points were found with respect to the dielectric constant of the modified SOG films 7:

(1) Dielectric constant is increased by the ion implantation; and (2) Relative dielectric constant became 3.5 irrespective of the ionic species to be implanted.

It was confirmed that, when a modified SOG film 7 is employed as an interlayer insulation film, via-contact holes 9 having excellent cross-sectional profiles with no recess can be formed, as shown in FIGS. 22 to 26, even in a structure where the modified SOG film 7 exposes to the side walls of the via-contact holes 9 as shown in FIG. 3C.

In order to supplement the descriptions of [A] to [D], various properties of the modified SOG films 7 were determined, and the results will now be described. FIGS. 27A, 27B, 28A and 28B each show dose-dependent change in the high-frequency CV characteristics in the modified SOG films 7. These FIGS. demonstrate that a dose of $1\times10^{15}$ cm$^{-2}$ or more is necessary.

Figure 29:
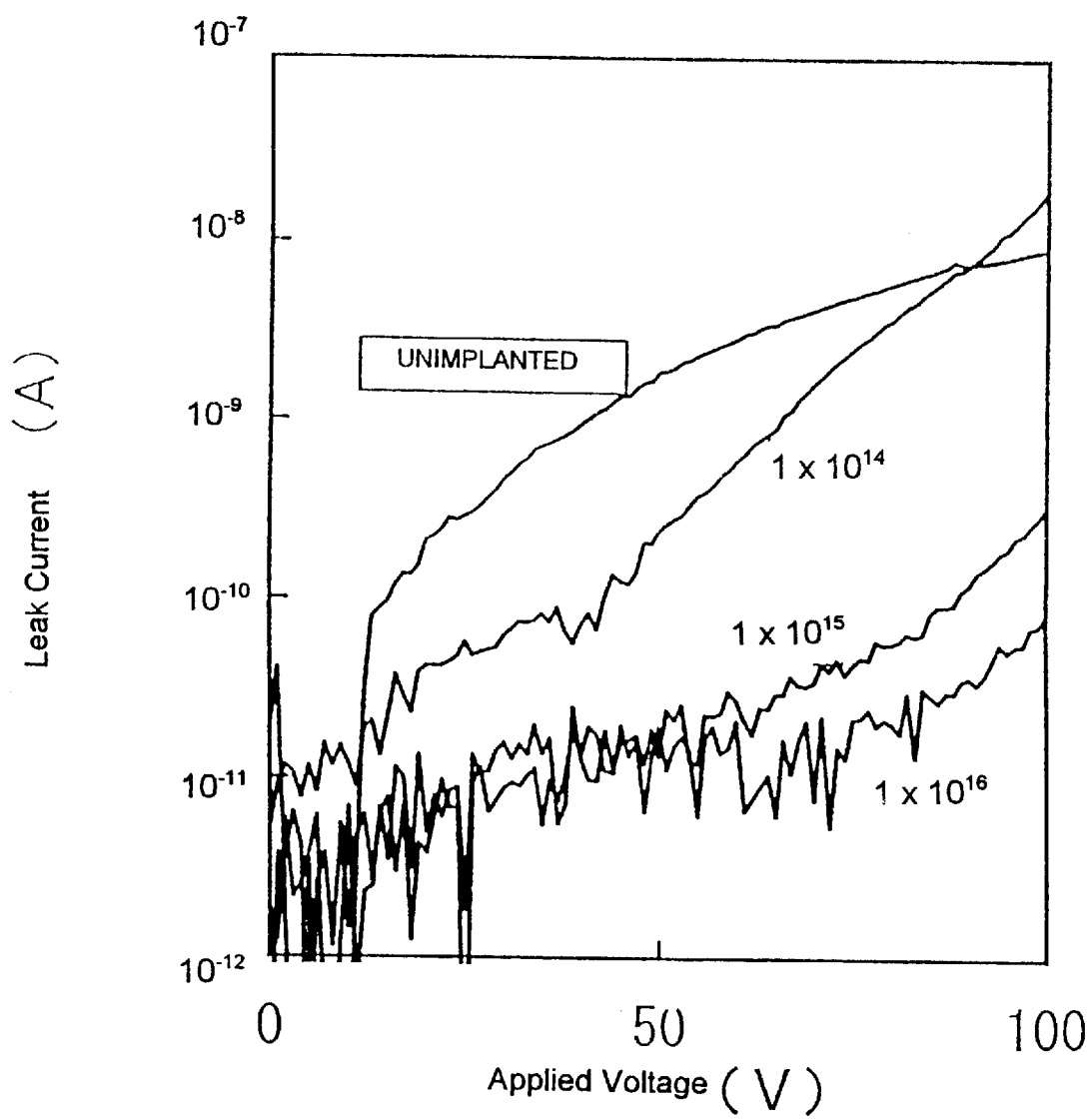

FIG. 29 shows dose dependency of leak current in the modified SOG films 7. With respect to the film thickness of the organic SOG films 6, the unimplanted film and the implanted films (dose: $1\times10^{15}$ cm$^{-2}$ and $1\times10^{15}$ cm$^{-2}$) had a thickness of 2500 Å; whereas the implanted film (dose: $1\times10^{14}$ cm$^{-2}$) had a thickness of 3000 Å. High leak current in the implanted film (dose: $1\times10^{14}$ cm$^{-2}$) in spite of its great thickness demonstrates that the film has poor quality.

Figure 30:
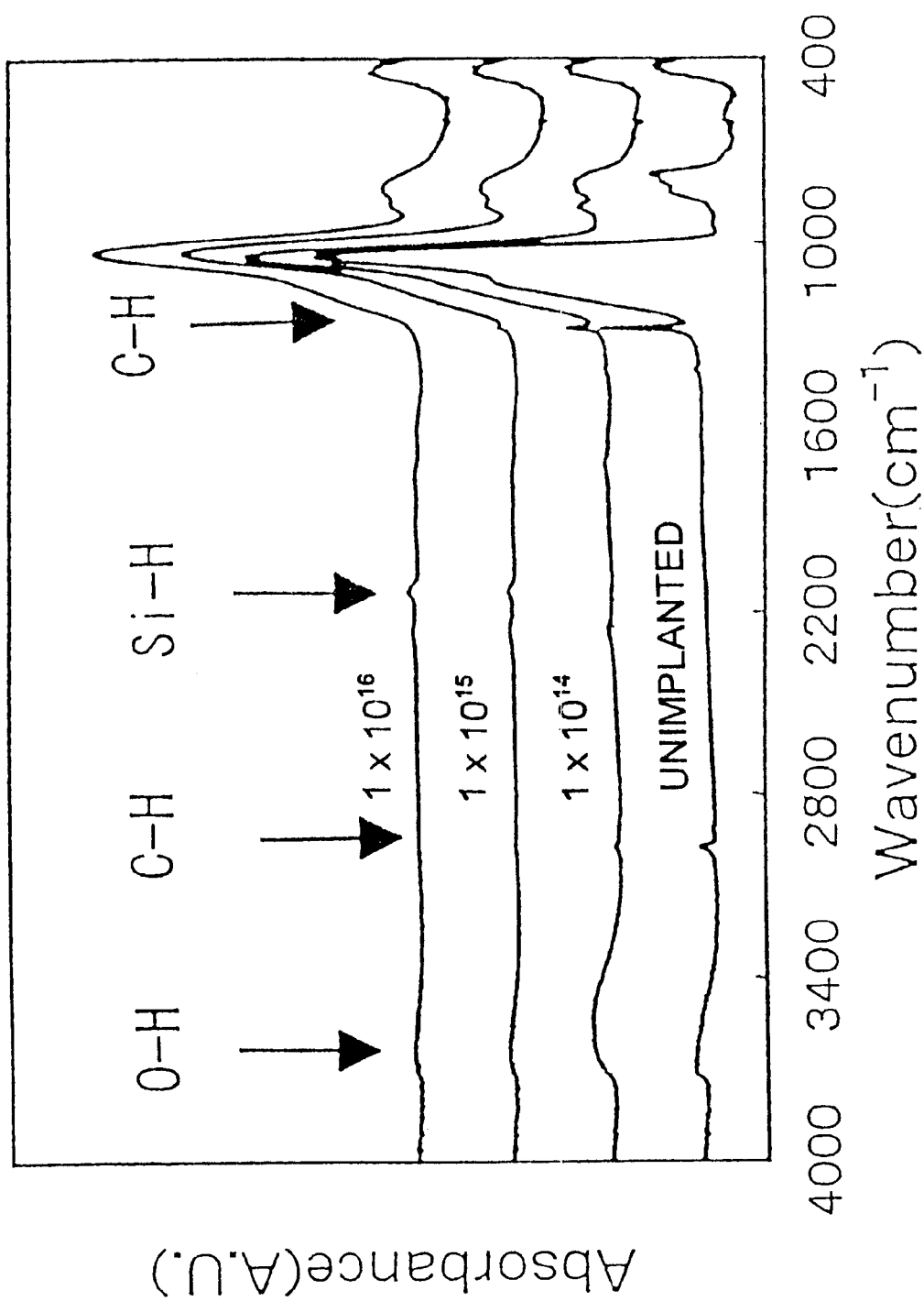

Dose-dependent change in the IR absorption spectrum of the modified SOG films 7 is shown in FIG. 30. Great C—H peaks are observed in the unimplanted film (organic SOG film 6) and in the implanted film (dose: $1\times10^{14}$ cm$^{-2}$), which means that there are great amount of residual organic components. The O—H peak is greater in the implanted film (dose: $1\times10^{14}$ cm$^{-2}$), which demonstrates that the film absorbed water or water was made in the film. In contrast, in the implanted films (dose: $1\times10^{15}$ cm$^{-2}$ and $1\times10^{16}$ cm$^{-2}$), the O—H peaks are small, which demonstrate that these films have good quality with small water content.

Figure 31A:
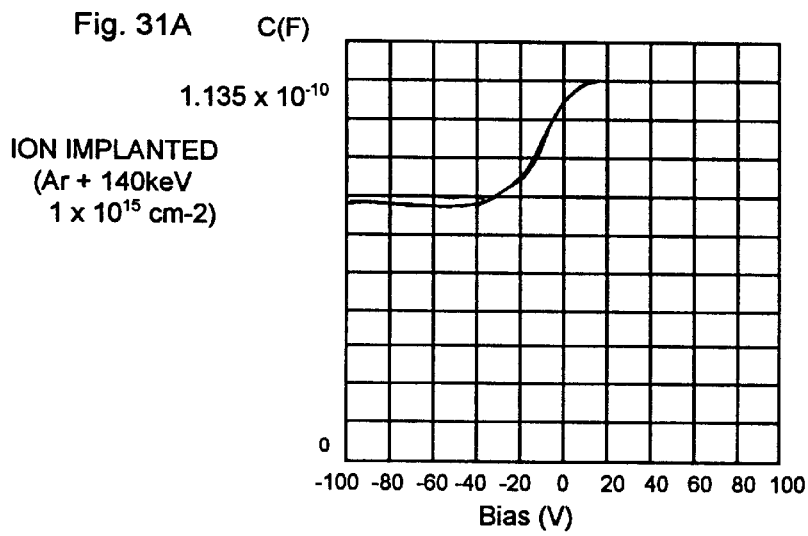
Figure 31B:
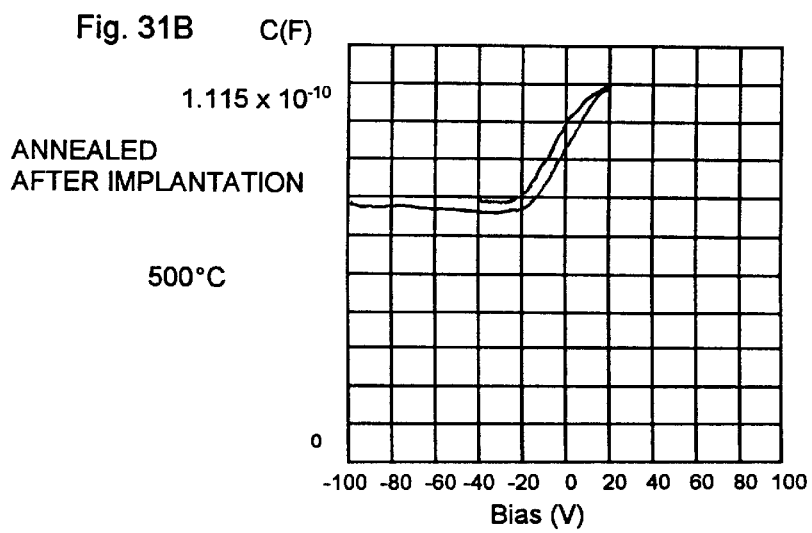
Figure 31C:
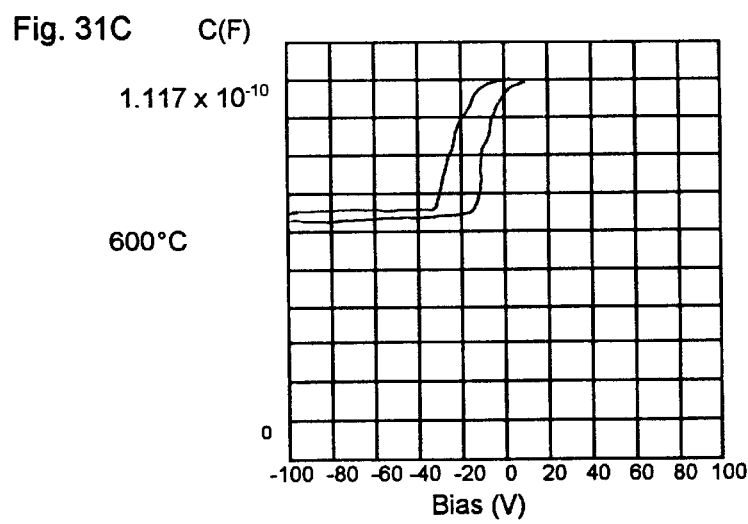

FIGS. 31A, 32B and 31C show changes in the high-frequency CV characteristics of the modified SOG film 7, caused by heat treatment. It can be understood that the modified SOG film 7 is thermally stable, since the characteristic curve was not substantially changed even after application of heat treatments. However, hysterisis was slightly increased by the heat treatments. FIG. 32 shows $O_2$ plasma resistance of the SOG film depending on the heat treatment temperature. Dielectric constant of the modified SOG film 7 was not changed substantially when the modified SOG film 7 is subjected to $O_2$ plasma treatment followed by heat treatment at high temperatures. This demonstrates that the modified SOG film has excellent quality and stability.

Figure 33:
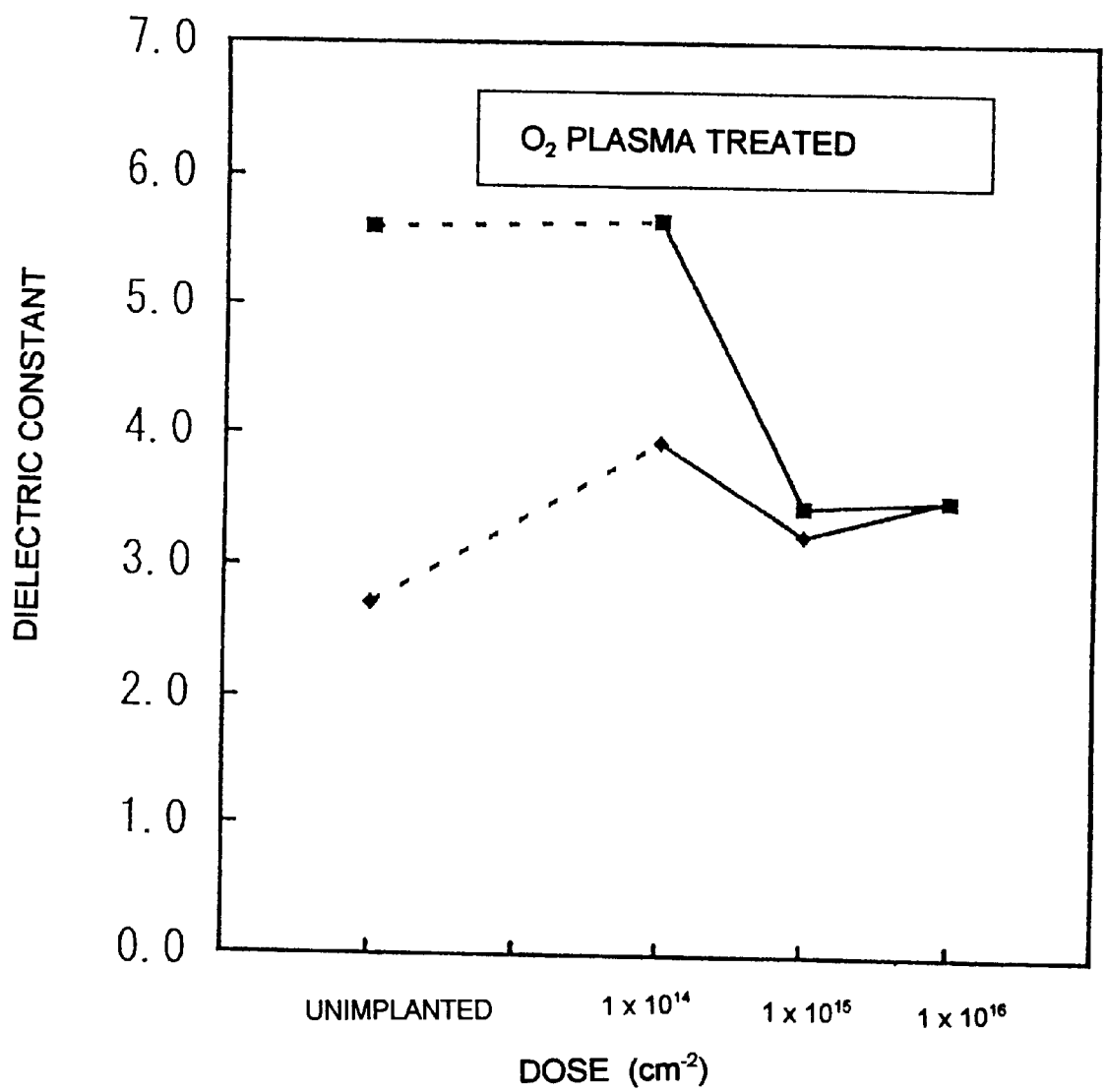
Figure 34:
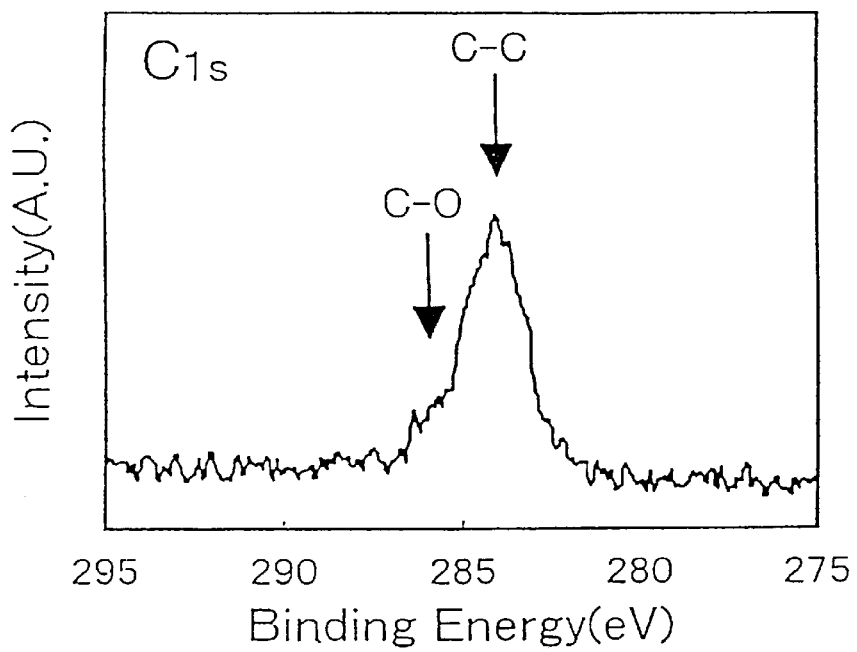

FIG. 33 shows dose-dependent $O_2$ plasma resistance of the SOG film. In the implanted film 7 (dose: $1\times10^{14}$ cm$^{-2}$), dielectric constant of the film was greatly increased by application of $O_2$ plasma treatment to such a level as achieved in the unimplanted film (organic SOG film 6). This demonstrates that it is essential to decompose the organic components in the organic SOG film 6 by the ion implantation so as to improve $O_2$ plasma resistance. FIG. 34 shows a spectrum ($C_{1S}$) of the modified SOG film 7 determined by XPS (X-ray Photoemission Spectroscopy). According to the spectrum, C—C bonds and C—O bonds are present in the modified SOG film 7. This shows that the observation with respect to FIG. 17 is correct.

Decomposition of the methyl group caused by the ion implantation can be expressed by the following scheme (3).

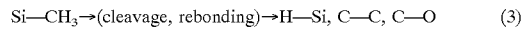

$$\text{Si—CH}_3 \rightarrow (\text{cleavage, rebonding}) \rightarrow \text{H—Si, C—C, C—O} \qquad (3)$$

In contrast, decomposition of the methyl group caused by $O_2$ plasma treatment can be expressed by the following scheme (4).

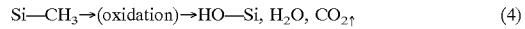

$$\text{Si—CH}_3 \rightarrow (\text{oxidation}) \rightarrow \text{HO—Si, H}_2\text{O, CO}_{2\uparrow} \qquad (4)$$

The data shown in FIGS. 27A, 27B to 31A, 31B, 31C and 32-24 can be summarized as follows:

(1) An organic SOG pre-film 6 is converted to a modified SOG film 7 having excellent quality with low hysterisis by carrying out implantation at a dose of at least $1\times10^{15}$ cm$^{-2}$;

(2) In the modified SOG film 7, leak current is smaller than in the organic SOG film 6;

(3) The modified SOG film 7 is deteriorated less even if exposed to oxygen plasma;

(4) The modified SOG film 7 has a dielectric constant of about 3.5 which is not changed by $O_2$ plasma exposure or heat treatment;

(5) Dielectric constant of the modified SOG film 7 becomes about 3.5 irrespective of the ionic species to be implanted;

(6) The carbon atoms remaining in the modified SOG film 7 form new C—C bonds and C—O bonds; and (7) The structure of the modified SOG film 7 is different from the structure of the organic SOG film 6 subjected to the $O_2$ plasma treatment.

Figure 35:
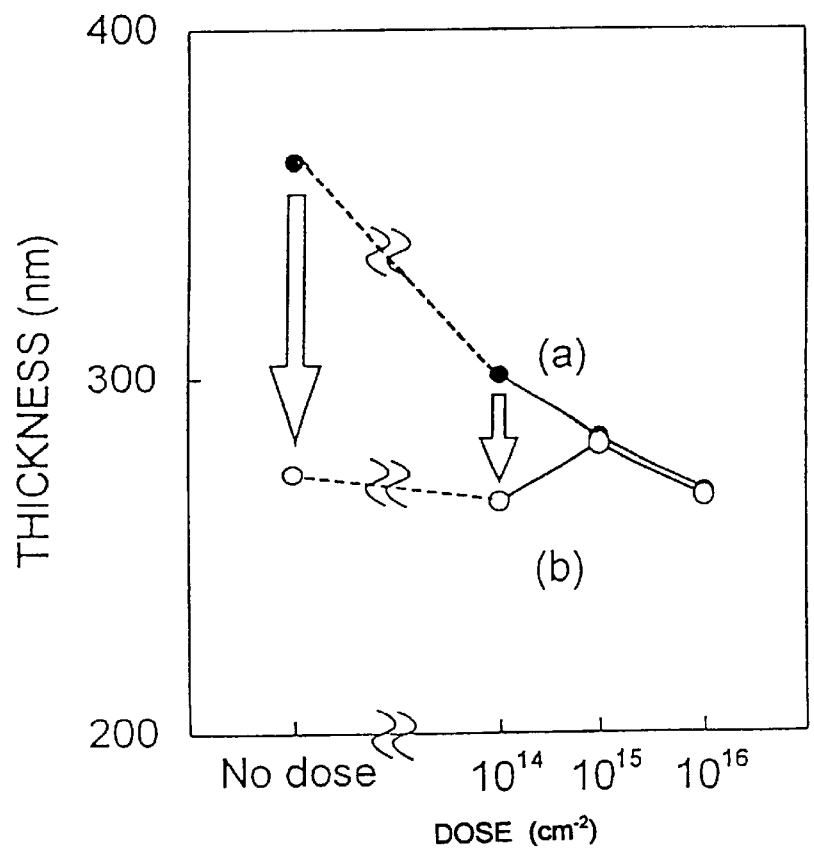

Next, to supplement the descriptions of the characteristics shown in FIGS. 27A, 27B to FIG. 31A, 31B, 31C and 32-24, the following properties were examined, and the results will now be described. The organic SOG pre-film 6 was implanted with $Ar^+$ to form a modified SOG film 7, which was then exposed to $O_2$ plasma, FIG. 35 shows change in the film thickness when the dose of argon ion ($Ar^+$) was varied. Incidentally, the $O_2$ plasma treatment was carried out using a microwave down-flow apparatus under the following conditions: microwave output: 1000 W; gas: mixed gas of oxygen, nitrogen and hydrogen; pressure: 400 Pa; treatment temperature: 220° C.; treatment time: 2.5 minutes. The ion implantation was carried out with an acceleration energy of 140 keV.

As described referring to FIG. 16, the film thickness is greatly reduced when the organic SOG film 6 was exposed to $O_2$ plasma. When the modified SOG film 7 was exposed to $O_2$ plasma, the film thickness was also reduced in the case of the film modified at the dose of $1\times10^{14}$ $cm^{-2}$. Accordingly, it can be understood that a dose of $1\times10^{15}$ $cm^{-2}$ or more is necessary so as to prevent shrinkage of the modified SOG film 7 to be caused by the $O_2$ plasma exposure.

Figure 36:
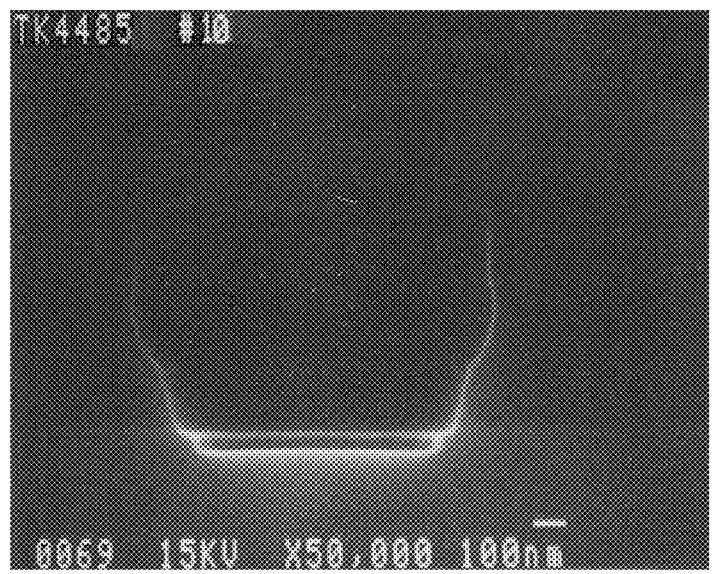
FIGS. 36 and 37 are micrographs showing cross sections of SOG films.
Figure 37:
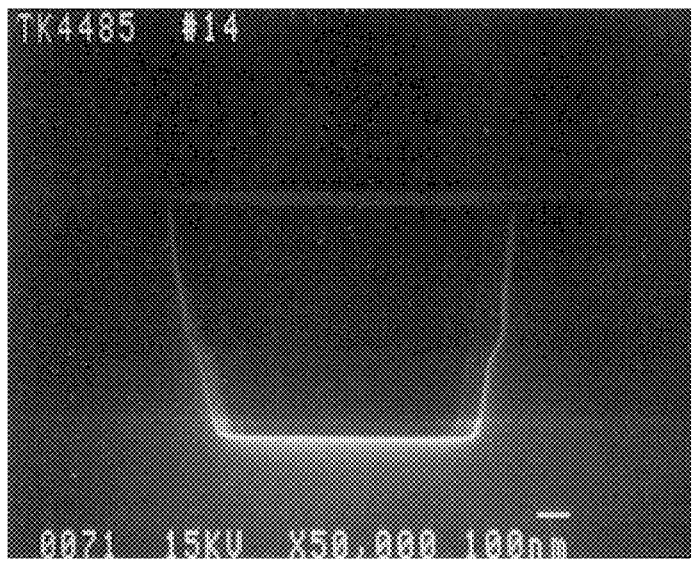

FIG. 36 is a microscopic photograph showing the cross-sectional profile of a via-contact hole 9 in a film implanted with $Ar^+$ at a dose of $1\times10^{15}$ $cm^{-2}$ with an acceleration energy of 20 keV, observed by means of cross-sectional SEM. FIG. 37 is a microscopic photograph showing the cross-sectional profile of a via-contact hole 9 in a film implanted with $Ar^+$ at a dose of $1\times10^{15}$ $cm^{-2}$ with an acceleration energy of 90 keV, observed by means of cross-sectional SEM.

While recesses are formed in FIGS. 36 and 37, no recess is formed in FIG. 24 (acceleration energy: 140 keV). These results demonstrate that an $Ar^+$ dose of $1\times10^{15}$ $cm^{-2}$ or more and an acceleration energy of 140 keV or more are necessary so as to prevent shrinkage of the modified SOG film 7.

Figure 38:
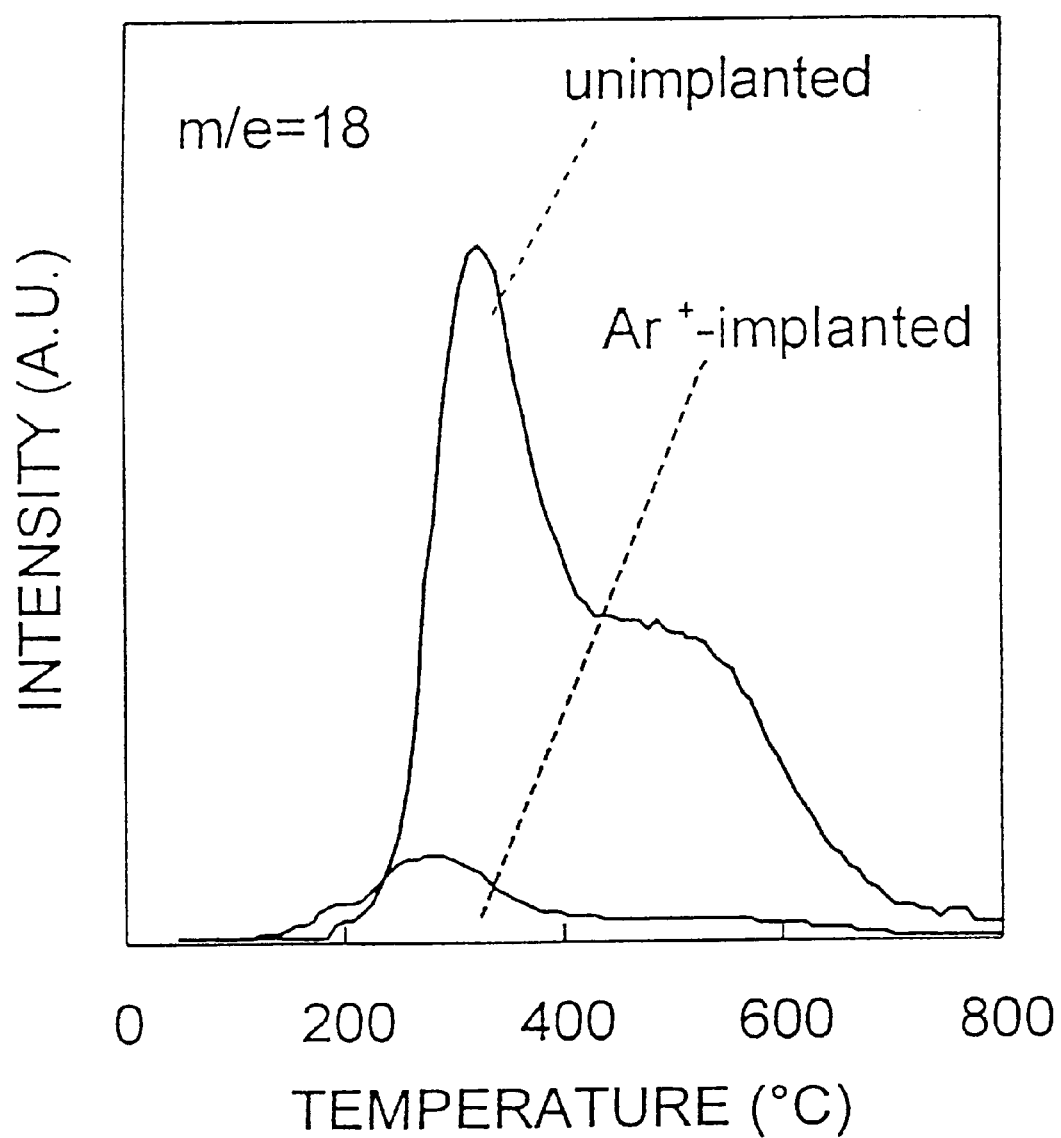
FIG. 38 is a graph illustrating the characteristics of SOG films.

$H_2O$ (m/e=18) was evaluated by means of TDS under the same conditions as in FIGS. 15A and 15B, and the result is shown in FIG. 38. As described with respect to FIGS. 15A and 15B, it can be understood that liberation of $H_2O$ (m/e=18) and $CH_3$ (m/e=15) is small in the modified SOG film 7.

Figure 39:
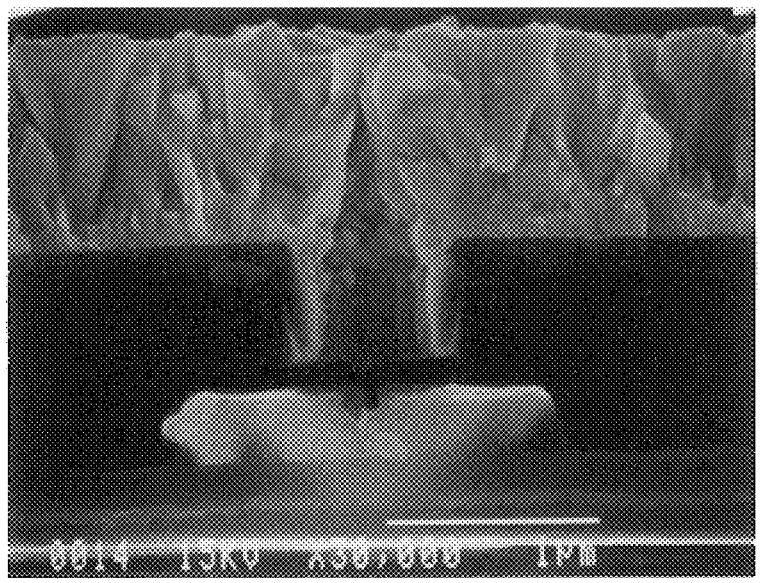
FIGS. 39 to 41 are micrographs showing cross sections of interlayer insulation films for semiconductor devices.
Figure 40:
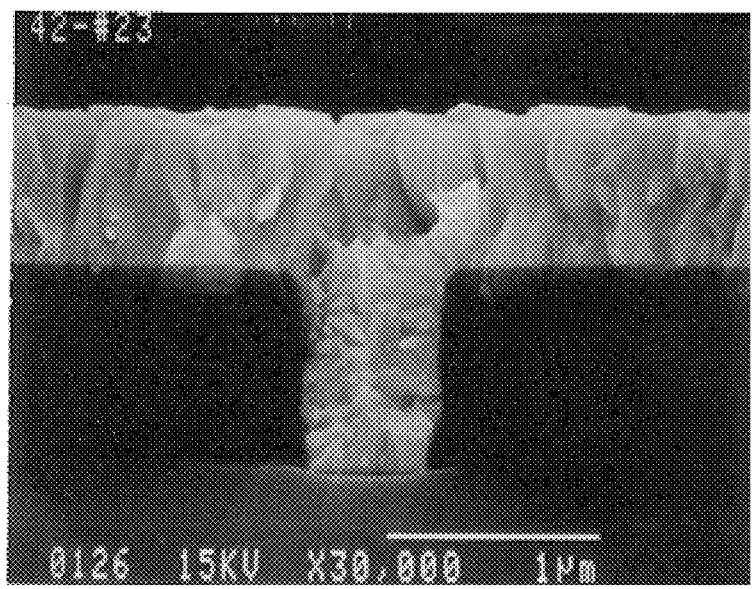

FIGS. 39 and 40 are microscopic photographs showing cross-sectional profiles of via-contact holes 9 in which tungsten plugs are to be formed, observed by cross-sectional SEM. FIG. 39 is the case where the organic SOG film 6 is not subjected to ion implantation; whereas FIG. 40 is the case where the organic SOG film 6 is subjected to $Ar^+$ implantation to form a modified SOG film 7 (dose: $1\times10^{15}$ $cm^{-2}$; acceleration energy: 140 keV). As shown in FIG. 39, in the case where no $Ar^+$ implantation was carried out, no tungsten plug is embedded in the via-contact hole 9. This is surmised to be due to liberation of $H_2O$ and $CH_3$. In contrast with FIG. 39, a tungsten plug is fully embedded in the via-contact hole 9 in the modified SOG film 7 shown in FIG. 40. This is surmised to be because the amounts of liberated $H_2O$ and $CH_3$ are small in the modified SOG film 7.

Figure 41:
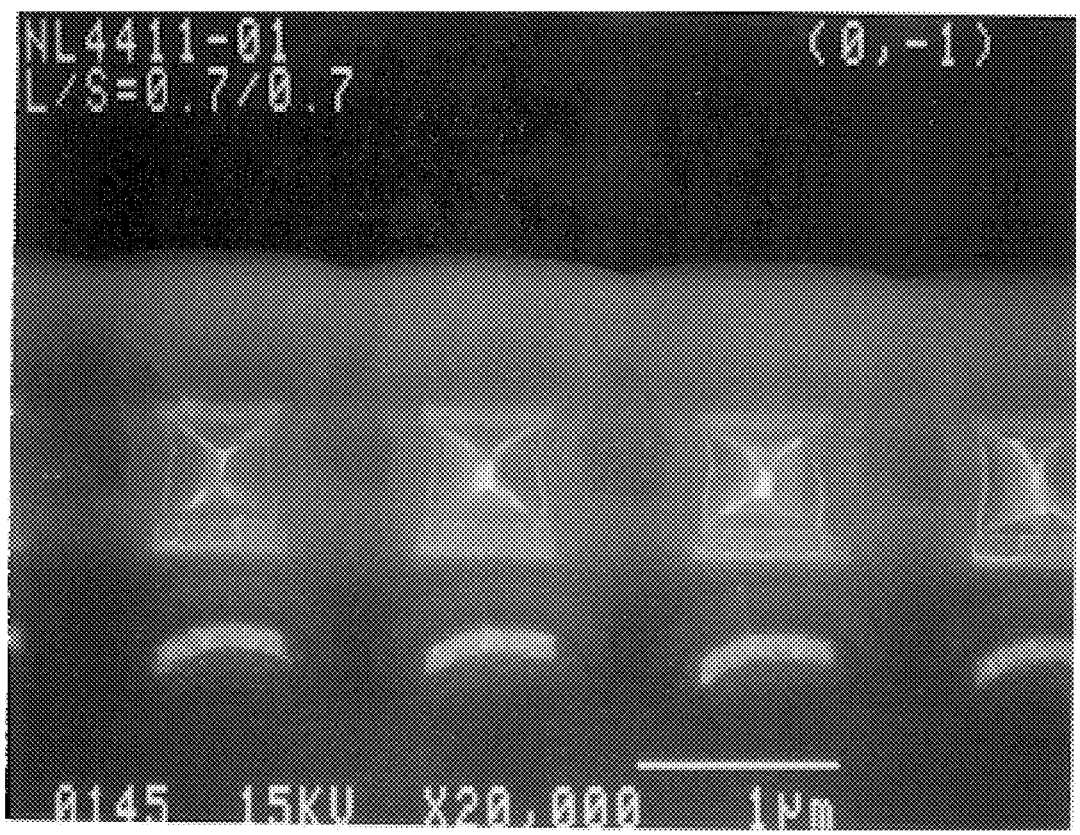

FIG. 41 is a microscopic photograph showing the cross-sectional profile of the modified SOG film 7 where metal trenches were formed at narrow intervals, observed by cross-sectional SEM. It can be seen that the modified SOG film 7 has excellent flatness and contains no cracking, peeling, etc.

Figure 42:
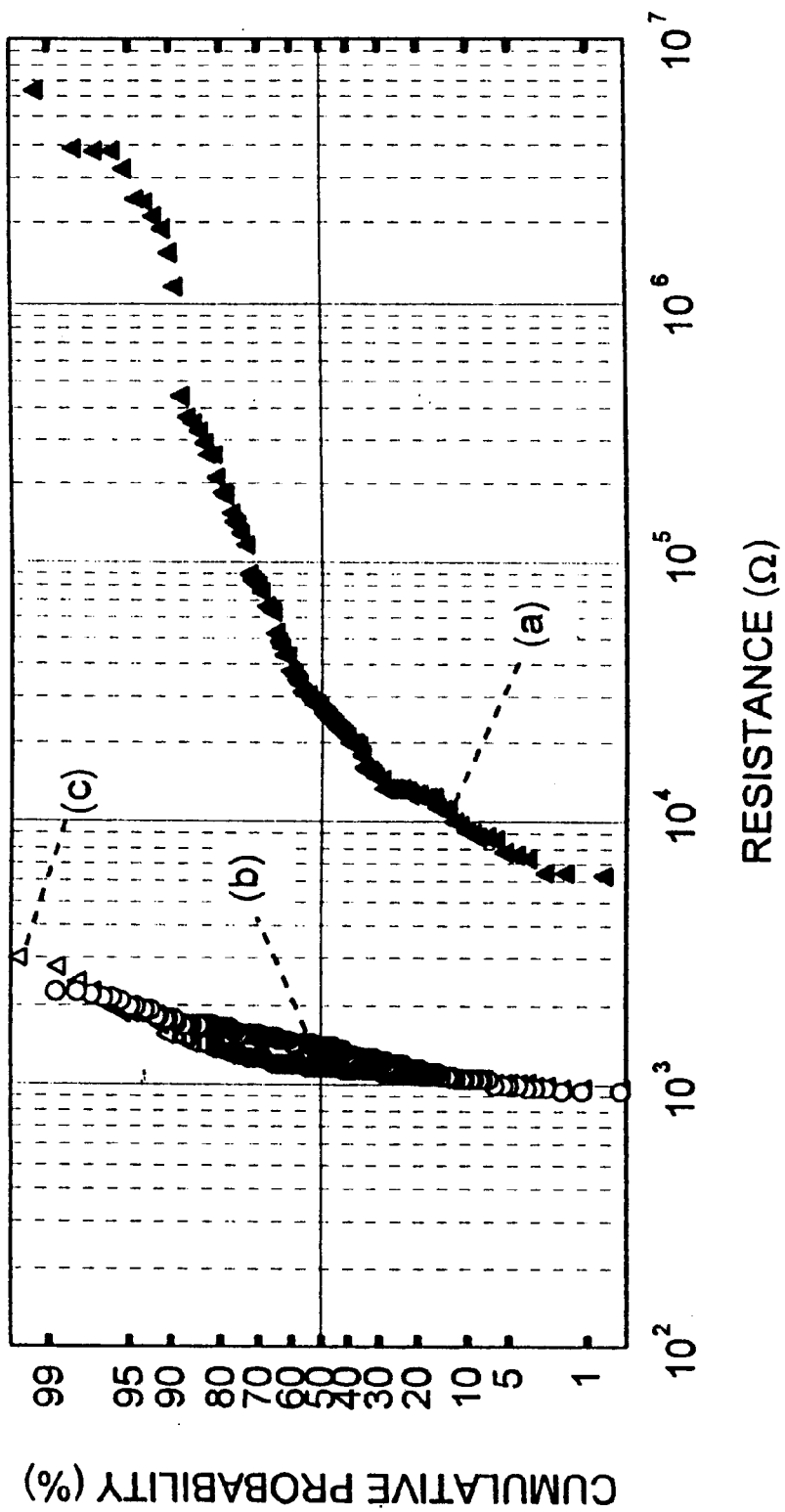
FIG. 42, 43 and 44 are graphs illustrating the characteristics of SOG films.

FIG. 42 shows variations in the resistance when 1000 via-contacts 9 containing tungsten plugs or aluminum electrodes are connected in series; in which (a) is the case where the via-contact holes 9 and aluminum electrodes were formed without subjecting the organic SOG film 6 to ion implantation; (b) is the case where the via-contact holes 9 and aluminum electrodes were formed in a modified SOG film 7 implanted with $Ar^+$; and (c) is the case where the via-contact holes 9 and tungsten plugs were formed in a modified SOG film 7 implanted with $Ar^+$. Incidentally, each of the via-contact holes 9 has a diameter of 0.7 µm. As shown in FIG. 42, the resistance of the via contacts in the modified SOG film 7 is far smaller than that of the via contacts in the organic SOG film 6.

Figure 44:
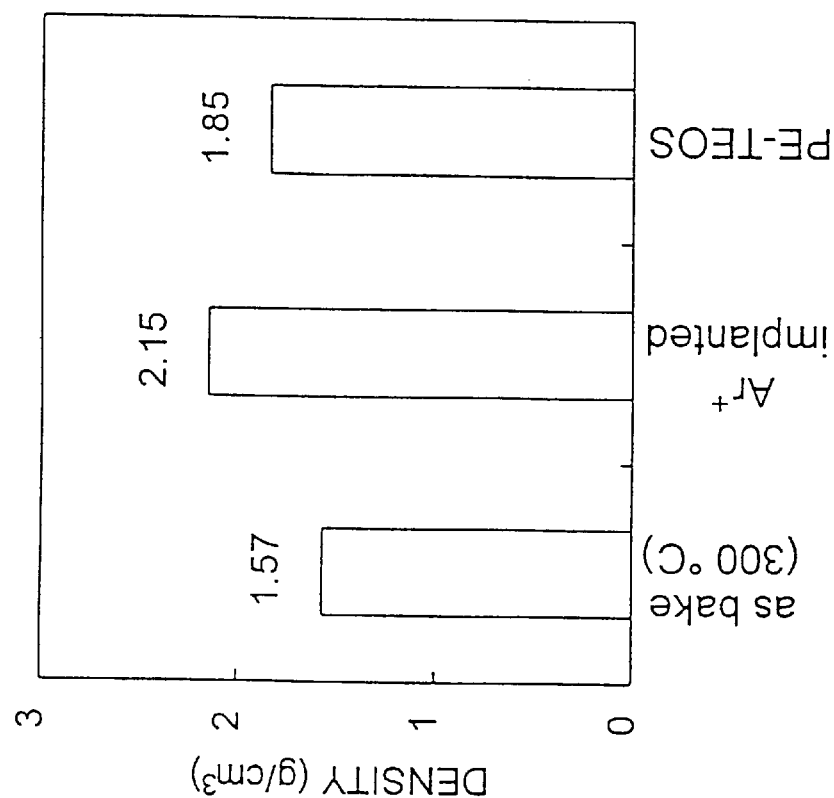
Figure 43:
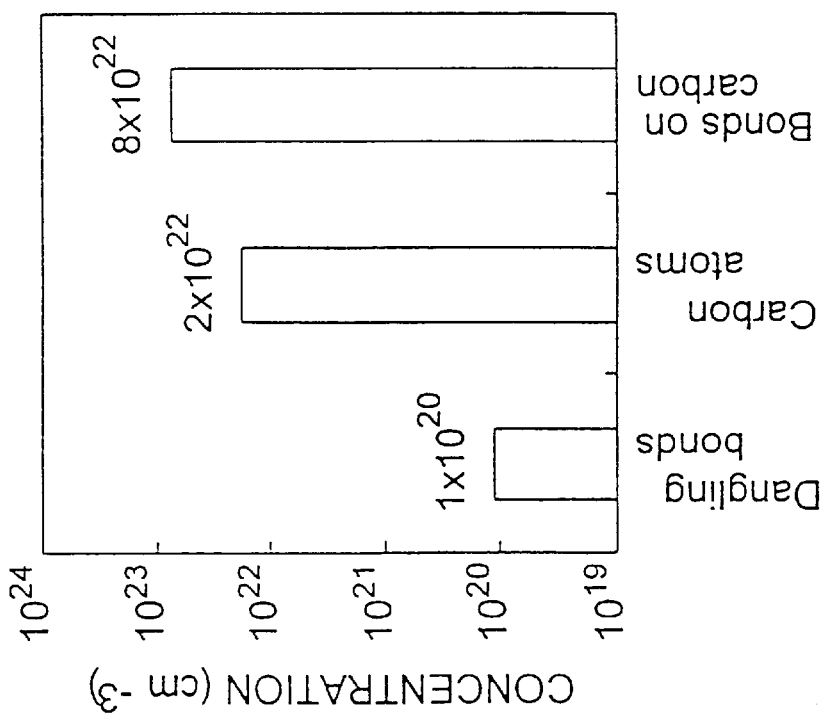

FIG. 43 shows concentrations of dangling bonds in the modified SOG film 7, carbon atoms and dangling bonds of the carbon atoms. The concentration of the dangling bonds in the modified SOG film 7 is smaller by two figures than that of the carbon atoms. FIG. 44 shows change in the film density when the organic SOG film 6 was subjected to heat treatment at 300° C. and then to $Ar^+$ implantation to provide a modified SOG film. It can be understood that the density of the modified SOG film 7 is still higher than in a PE-TEOS film which is known to have high density.

The following descriptions are advantages or effects exhibited by implanting ions into organic SOG pre-films 6 for forming modified SOG films 7.

(1) All of the above-mentioned ions (silicon fluoride ion, boron fluoride ion, argon ion, phosphorus ion, silicon ion, boron ion, and nitrogen ion) except for simple fluorine ion have no aluminum-corroding property, property of lowering dielectric constant of the gate insulation film 2 or property of inhibiting diffusion of impurity such as phosphorus and boron. Accordingly, if such ion (such as silicon fluoride ion, boron fluoride ion, argon ion, silicon ion, boron ion or nitrogen ion) is implanted into the organic SOG pre-film 6, the problems associated with fluorine ion can be obviated. Consequently, even when aluminum is used for wiring, the wiring will not be corroded as well as dielectric constant of the gate insulation film 2 will not be lowered. Further, even when the source and drain regions 4 are formed by impurity diffusion such as of phosphorus and boron, diffusion of the impurity is not inhibited. Accordingly, a MOS transistor element having the designed characteristics can be formed.

(2) Referring to the phosphorus ion and phosphorus-containing compound ions, the phosphorus atoms can react with the water contained in the organic SOG film 6 to form phosphoric acid ($H_3PO_4$) which is likely to corrode aluminum wiring. Referring to the silicon ion and silicon-containing compound ions, they tend to increase conductivity of the modified SOG film 7. Accordingly, phosphorus ion, phosphorus-containing compound ions, silicon ion and silicon-containing compound ions are not very preferred as the ions to be implanted into the organic SOG film 6, although not so much as single fluorine ion is.

(3) The silicon ion and silicon-containing compound ions increase conductivity of the modified SOG film 7 to exhibit deteriorated performance as the interlayer insulation film.

(4) Since the fluorine-containing compound ions have a large molecular weight compared with the simple fluorine ion and can be diffused with difficulty, they exhibit the above-described properties less notably. Accordingly, the fluorine-containing compound ions can also obviate the problems associated with fluorine ion.

(5) To summarize the above paragraphs (1) to (4), fluorine-containing compound ions (silicon fluoride, boron fluoride, etc.), argon ion, boron ion and nitrogen ion are preferred as the ions to be implanted into the organic SOG film 6. It should be noted here that as the ions to be implanted to the organic SOG film 6, the following ions can be given in addition to those listed above:

(i) Inert gas ions other than argon, such as helium ion, neon ion, krypton ion, xenon ion and radon ion. These inert gas ions do not react with the organic SOG film 6, so that there is no liability that the film 6 is affected by the ion implantation.

(ii) Simple ions of Groups IIIb, IVb, Vb, VIb and VIIb elements other than boron and nitrogen. Particularly, simple ions of elements such as oxygen, aluminum, sulfur, chlorine, gallium, germanium, arsenic, selenium, bromine, antimony, iodine, indium, tin, tellurium, lead and bismuth, and compounds of these elements. Of these ions, the metallic element ions are liable to lower dielectric constant of the modified SOG film 7. However, the reduction in the dielectric constant is not significant, they give no problems in practical uses, unless the modified SOG film 7 is used as an interlayer insulation film which is required to have a particularly high dielectric constant.

(iii) Simple ions of Groups IVa and Va elements and compound ions of these elements. Particularly, simple ions of elements such as titanium, vanadium, niobium, hafnium and tantalum, and compounds ions of these elements. Since oxides of the Group IVa and Va elements have a high dielectric constant, they can increase dielectric constant of the modified SOG film 7.

(iv) Combinations of two or more of the above listed ions. In this case, enhanced effect can be obtained by the synergistic effect between the ions.

Although only two embodiments of the present invention have been described herein, it should be apparent to those skilled in the art that the present invention may be embodied in many other specific forms without departing from the spirit or scope of the invention. Particularly, it should be understood that the present invention may be embodied in the following manners.

The silicon oxide films 5 and 8 may be formed by a method other than plasma CVD, for example, atmospheric CVD, vacuum CVD, ECR (Electron Cyclotron Resonance) plasma CVD, optical pumping CVD, TEOS-CVD and PVD (Physical Vapor Deposition). In this case, the gas used in the atmospheric CVD method is a mixture of monosilane and oxygen ($SiH_4+O_2$), and the films 5 and 8 are formed at a temperature of 400° C. or lower. In the vacuum CVD method, a mixture of monosilane and nitrogen suboxide ($SiH_4+N_2O$) is used, and the films 5 and 8 are formed at a temperature of 900° C. or lower.

The silicon oxide films 5 and 8 may be replaced with other insulation films (e.g., silicon nitride film and silicate glass film) having high insulating property and mechanical strength, as well as, the property of blocking water. Such insulating film can be formed by means of CVD or PVD.

The source and drain electrodes 10 and the wiring 23 may be formed using other conductive materials than aluminum (e.g., copper, gold, silver, silicide, high-melting metals, doped polysilicons, titanium nitride (TiN) and alloys such as tungsten titanium (TiW), or a laminated structure of such materials.

The modified SOG film 7 may be subjected to heat treatment. In this case, the number of dangling bonds in the modified SOG film 7 is reduced, so that not only hygroscopicity but also water permeability of the film 7 can be reduced further.

The composition of the organic SOG pre-film 6 may be that of the general formula (2).

The organic SOG pre-film 6 may be replaced by an inorganic SOG film represented by the general formula (1). The inorganic SOG film should be subjected to ion implantation. In this case, the water and hydroxyl groups contained in the inorganic SOG film can be reduced.

The modified SOG film 7 according to the present invention may be used as a passivation film. In this case, the film 7 will be an excellent passivation film which can securely protect the device from mechanical and chemical attacks.

When the modified SOG films 7 are used as interlayer insulation films between wiring layers in a multilayered wiring structure, the organic SOG films 6 may be subjected to ion implantation according to any one of the following methods (a) and (b).

(a) To carry out ion implantation each time an SOG film 6 is formed in each layer. For example, when two layers of modified SOG films 7 are to be formed, a first organic SOG film 6 formed on a first wiring layer is subjected to ion implantation to form a first modified SOG film 7, and then a second wiring and a second organic SOG film 6 are formed successively, followed by ion implantation to form a second modified SOG film 7.

(b) SOG films 6 are all formed, and then all of them are subjected to ion implantation. For example, when two layers of modified SOG films 7 are to be formed, a first organic SOG film 6 is formed on a first wiring layer, and then a second wiring layer and a second organic SOG film 6 are formed successively, finally followed by ion implantation against the surface of the device to convert the first and second organic SOG films 6 into modified SOG films 7.

Therefore, the present examples and embodiments are to be considered as illustrative and not restrictive, and the invention is not to be limited to the details given herein, but may be modified within the scope of the appended claims.

What is claimed is:

1. A method for producing a semiconductor device, comprising the steps of:

forming a SOG film on an incomplete semiconductor device by means of a spin-on-glass (SOG) process; and forming a modified SOG film by doping said SOG film with at least one impurity ion including ions of fluorine-containing compounds selected from the group consisting of silicon fluoride and boron fluoride.

2. The method according to claim 1, wherein said SOG film is one of organic SOG film and inorganic SOG film.

3. The method according to claim 1, further comprising the step of forming an insulating film on said incomplete semiconductor device, prior to the formation of said SOG film, said insulating film having high insulating property, high mechanical strength and the property of blocking water.

4. A method for producing a semiconductor device, comprising the steps of:

forming an SOG film on an incomplete semiconductor device by means of a spin-on-glass (SOG) Process; and forming a modified SOG film by doping said SOG film with boron ion; and forming an insulating film on said modified SOG film, said insulating film having high insulating property, high mechanical strength and the property of blocking water.

5. The method according to claim 4, wherein said insulating film is a silicon oxide film.

6. The method according to claim 3, wherein said insulating film is a silicon oxide film.

7. A method for producing a semiconductor device, comprising the steps of:

forming an SOG film on an incomplete semiconductor device by means of a spin-on-glass (SOG) process;

forming a modified SOG film by doping said SOG film with at least one impurity ion selected from the group consisting of helium (He), neon (Ne), argon (Ar), krypton (Kr), xenon (Xe) and radon (Rn); and forming an insulating film on said modified SOG film, said insulating film having high insulating property, high mechanical strength and the property of blocking water.

8. The method according to claim 7, wherein said insulating film is a silicon oxide film.

9. A method for producing a semiconductor device, comprising the steps of:

forming an SOG film on an incomplete semiconductor device by means of a spin-on-glass (SOG) process;

forming a modified SOG film by doping said SOG film with at least one impurity ion selected from the group consisting of boron (R), nitrogen (N), oxygen (O), aluminum (Al), sulfur (S), chlorine (Cl), gallium (Ga), germanium (Ge), arsenic (As), selenium (Se), bromine (Br), antimony (Sb), iodine (I), indium (In), tin (Sn), tellurium (Te), lead (Pb), bismuth (Bi), titanium (Ti), vanadium (V), niobium (Nb), hafnium (Hf) and tantalum (Ta); and ions of compounds containing any one of B, N, O, Al, S, Cl, Ga, Ge, As, Se, Br, Sb, I, In, Sn, Te, Pb, Bi, Ti, V, Nb, Hf and Ta; and forming an insulating film on said modified SOG film, said insulating film having high insulating property, high mechanical strength and the property of blocking water.

10. The method according to claim 9, wherein said insulating film is a silicon oxide film.

11. The method according to claim 1 further comprising the step of forming an insulating film on said modified SOG film, said insulating film having high insulating property, high mechanical strength and the property of blocking water.

12. The method according to claim 11, wherein said insulating film is a silicon oxide film.

13. A method for producing a semiconductor device, comprising the steps of:

forming an SOG film on an incomplete semiconductor device by means of a spin-on-glass (SOG) process;

forming a modified SOG film by doping said SOG film with at least one impurity ion selected from the group consisting of inert gas ions, ion of boron (B), ion of arsenic (As), ions of boron-containing compounds and ions of arsenic-containing compounds; and forming an insulating film on said modified SOG film, said insulating film having high insulating property, high mechanical strength and the property of blocking water.

14. The method according to claim 13, wherein said insulating film is a silicon oxide film.

* * * * *